(12) United States Patent
Chiang et al.

(10) Patent No.: US 10,128,156 B1
(45) Date of Patent: Nov. 13, 2018

(54) FINFET DEVICE WITH REDUCED PARASITIC CAPACITANCE AND METHOD FOR FABRICATING THE SAME

(71) Applicant: TAIWAN SEMICONDUCTOR MANUFACTURING CO., LTD., Hsinchu (TW)

(72) Inventors: Hsin-Che Chiang, Taipei (TW); Wen-Li Chiu, Kaohsiung (TW); Chun-Sheng Liang, Changhua County (TW); Jeng-Ya David Yeh, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/825,513

(22) Filed: Nov. 29, 2017

(51) Int. Cl.
*H01L 21/8234* (2006.01)
*H01L 27/088* (2006.01)
*H01L 29/51* (2006.01)
*H01L 29/66* (2006.01)
*H01L 29/06* (2006.01)

(52) U.S. Cl.
CPC ........... *H01L 21/823481* (2013.01); *H01L 21/823431* (2013.01); *H01L 27/0886* (2013.01); *H01L 29/0649* (2013.01); *H01L 29/518* (2013.01); *H01L 29/6656* (2013.01); *H01L 29/66545* (2013.01)

(58) Field of Classification Search
CPC .............. H01L 21/823481; H01L 21/823431
See application file for complete search history.

(56) References Cited

U.S. PATENT DOCUMENTS

| | | | |
|---|---|---|---|
| 2017/0141111 A1* | 5/2017 | Deng | H01L 27/0886 |
| 2017/0186882 A1* | 6/2017 | Koldiaev | H01L 29/78696 |
| 2017/0345936 A1* | 11/2017 | Ching | H01L 29/7851 |
| 2017/0352659 A1* | 12/2017 | Basker | H01L 27/0886 |
| 2017/0352744 A1* | 12/2017 | Basker | H01L 29/66795 |

* cited by examiner

*Primary Examiner* — Douglas Menz
(74) *Attorney, Agent, or Firm* — Maschoff Brennan

(57) ABSTRACT

A FinFET device and a method for fabricating the same are provided. In the method for fabricating the FinFET device, at first, a semiconductor substrate having fin structures is provided. Then, a dielectric layer and a dummy gate structure are sequentially formed on the semiconductor substrate. The dummy gate structure includes two dummy gate stacks, a gate isolation structure formed between and adjoining the dummy gate stacks, and two spacers sandwiching the dummy gate stacks and the gate isolation structure. Then, the dummy gate stacks are removed to expose portions of the dielectric layer and to expose sidewalls of portions of the spacers. Thereafter, an oxidizing treatment is conducted on the exposed portions of the dielectric layer and the portions of the spacers to increase quality of the dielectric layer.

20 Claims, 34 Drawing Sheets

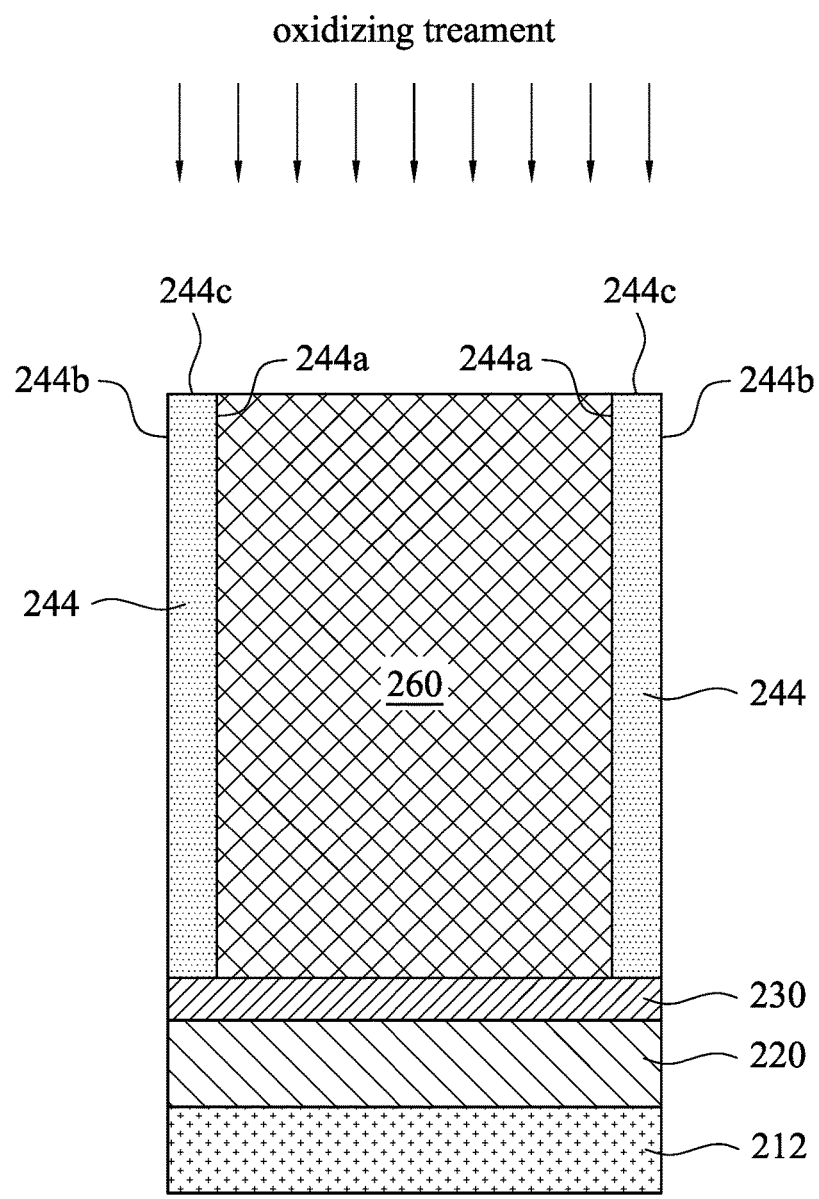
Fig. 2J"

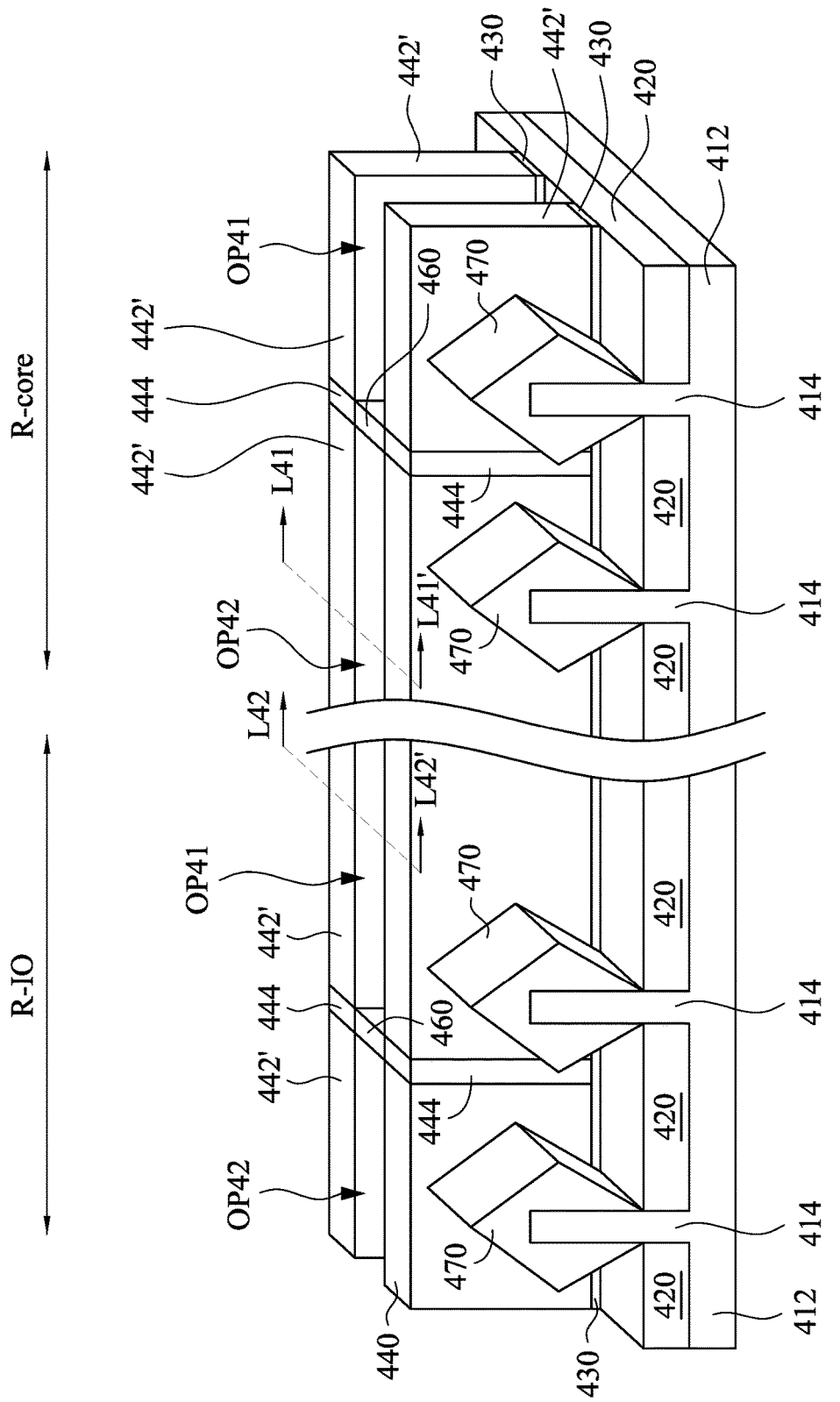

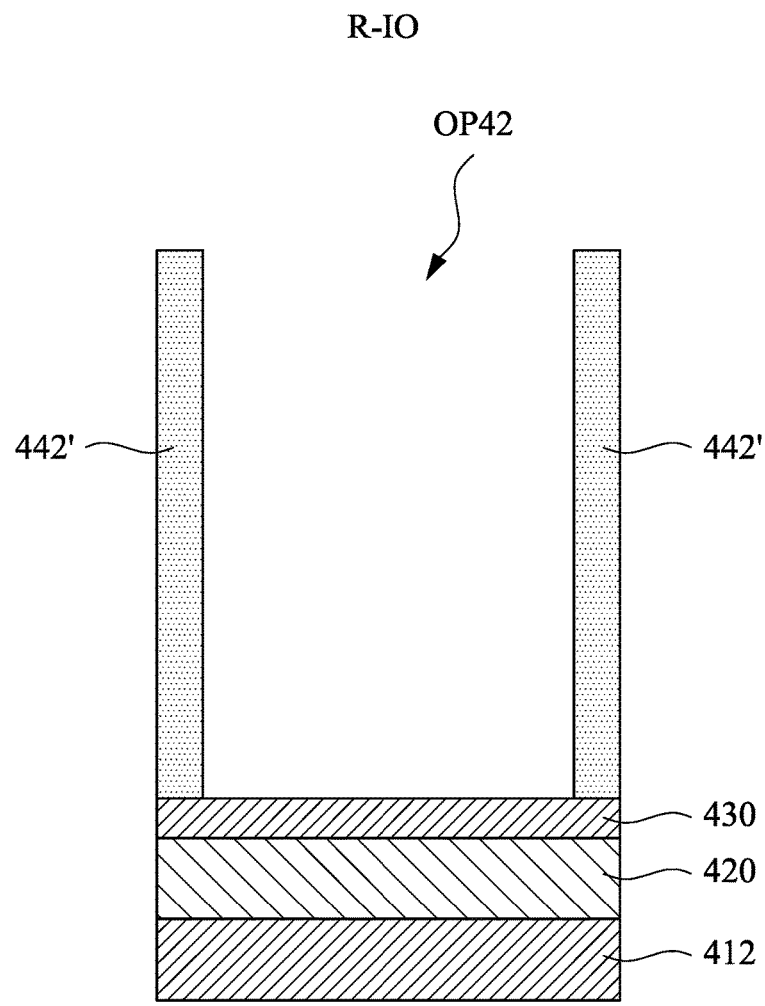
Fig. 4K"

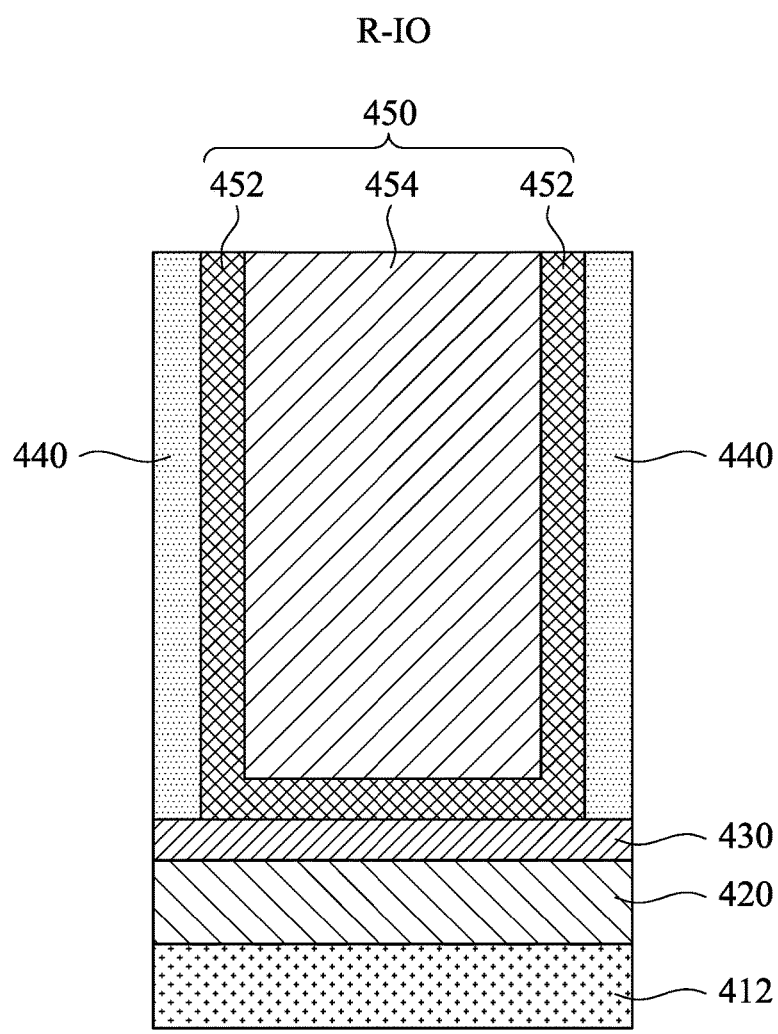
Fig. 4L"

FINFET DEVICE WITH REDUCED PARASITIC CAPACITANCE AND METHOD FOR FABRICATING THE SAME

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2J' is a cross-sectional view of the FinFET device viewed along line L2-L2' in FIG. 2J.

FIG. 2J" is a cross-sectional view of the FinFET device viewed along line L22-L22' in FIG. 2J.

FIG. 4K' is a schematic cross-sectional view of the region R-core viewed along line L41-L41' in FIG. 4K.

FIG. 4K" is a schematic cross-sectional view of the region R-IO viewed along line L42-L42' in FIG. 4K.

FIG. 4L" is a schematic cross-sectional view of the region R-IO viewed along line L42-L42' in FIG. 4K.

DETAILED DESCRIPTION

Figure 1A:
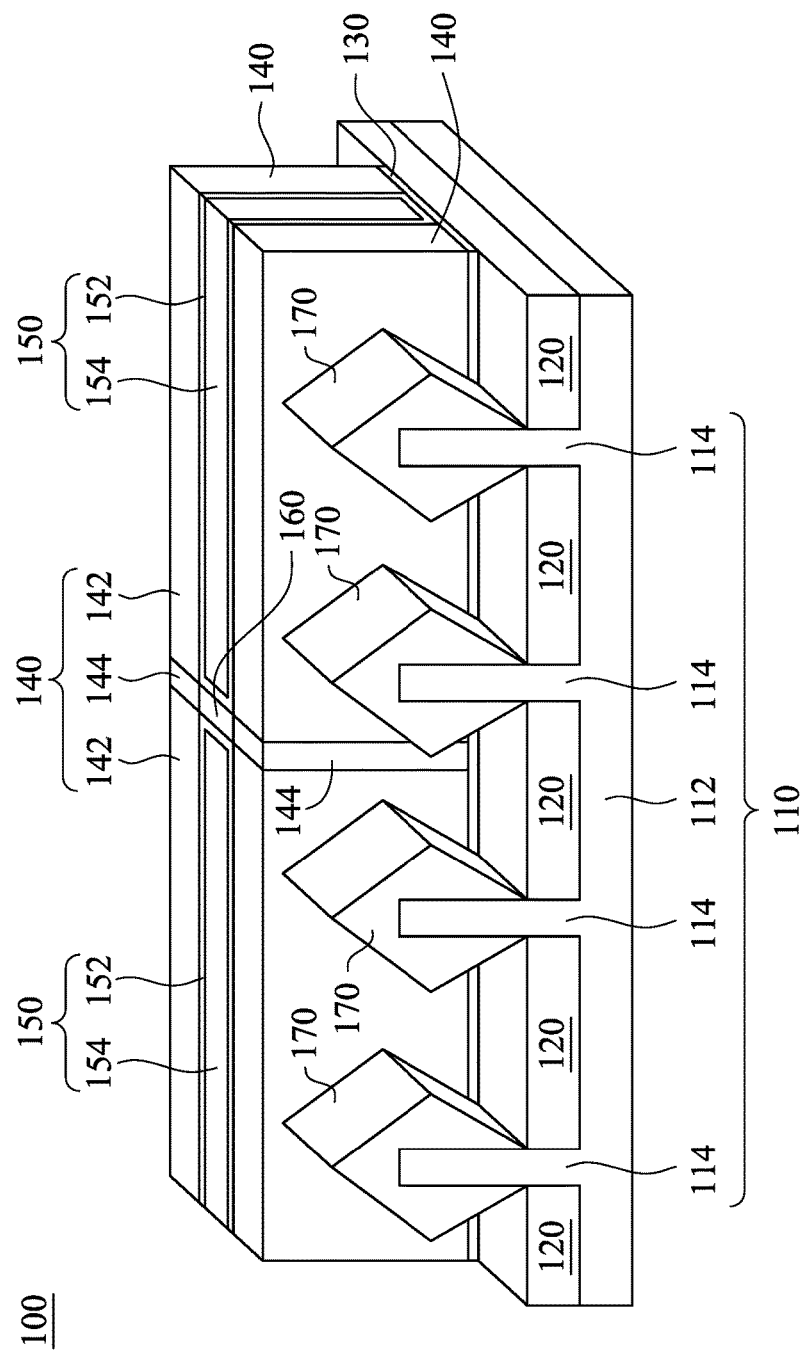
FIG. 1A is a schematic three-dimensional diagram showing a FinFET device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure are directed to a fin field-effect transistor (FinFET) device with reduced parasitic capacitance and a method for fabricating the FinFET device. In the method for fabricating the FinFET device, at first, a semiconductor substrate having fin structures is provided. Then, a dielectric layer and a dummy gate structure are sequentially formed on the semiconductor substrate. The dummy gate structure includes two spacers, two dummy gate stacks disposed between the spacers, and a gate isolation structure disposed between the dummy gate stacks. Then, the dummy gate stacks are removed to expose portions of the dielectric layer and to expose sidewalls of a portion of the spacers. Thereafter, an oxidizing treatment is conducted on the exposed portions of the dielectric layer and the portion of the spacers. Because the exposed portions of the dielectric layer are oxidized, the quality of the dielectric layer is improved. Further, because the portion of the spacers is oxidized, the dielectric constant of the portion of the spacers is decreased to reduce the parasitic capacitance of the FinFET device.

Referring to FIG. 1A, FIG. 1A is a schematic three-dimensional diagram showing a fin field-effect transistor (FinFET) device 100 in accordance with some embodiments of the present disclosure. The FinFET device 100 includes a semiconductor substrate 110, device isolation structures 120, a dielectric layer 130, two spacers 140, gate stacks 150, a gate isolation structure 160 and sources/drains 170.

The semiconductor substrate 110 has at least one fin. As shown in FIG. 1A, the semiconductor substrate 110 includes a bottom 112 and four fins 114 located on the bottom 112. The semiconductor substrate 110 may be a semiconductor material and may include structures including a graded layer or a buried oxide, for example. In some embodiments, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The device isolation structures 120 are disposed on the semiconductor substrate 110. In some embodiments, the device isolation structures 120 are shallow trench isolations (STIs) and formed by chemical vapor deposition (CVD) techniques using tetra-ethyl-ortho-silicate (TEOS) and oxygen as a precursor. In some embodiments, the device isolation structures 120 are formed by implanting ions, such as oxygen, nitrogen, carbon, or the like, into the device isolation structures 120. In other embodiments, the device isolation structures 120 are insulator layers of a SOI wafer.

The dielectric layer 130 is disposed on the semiconductor substrate 110 to cover the fins of the semiconductor substrate 110. The dielectric layer 130 can be formed from a high-k material, such as lanthanum oxide, aluminum oxide, hafnium oxide, hafnium oxynitride, or zirconium oxide, or combinations thereof. Additionally, any combination of silicon dioxide, silicon oxynitride, and/or high-k materials may also be used for the dielectric layer 130.

The spacers 140 are disposed on the dielectric layer 130, and sandwich the gate stacks 150 and the gate isolation structure 160, and thus a gate structure including the spacers 140, the gate stacks 150 and the gate isolation structure 160 is formed over the dielectric layer 130 and crosses the fins 114. The gate isolation structure 160 is disposed between and adjoining the gate stacks 150 to isolate the gate stacks 150 from each other. In some embodiments, the gate stacks 150 are high-k metal gate structures. For example, each of the gate stacks 150 includes a high-k dielectric layer 152 and a metal gate electrode 154. However, embodiments of the present disclosure are not limited thereto. Further, in some embodiments, the gate isolation structure 160 is formed from nitride, but embodiments of the present disclosure are not limited thereto.

The sources/drains 170 are disposed on and contact the fins of the semiconductor substrate 110. In some embodiments, the sources/drains 170 are formed from silicon germanium and epitaxially grown from a surface of the semiconductor substrate 110, but embodiments of the present disclosure are not limited thereto. In some embodiments, the sources/drains 170 include an n-type or p-type dopant.

Figure 1B:
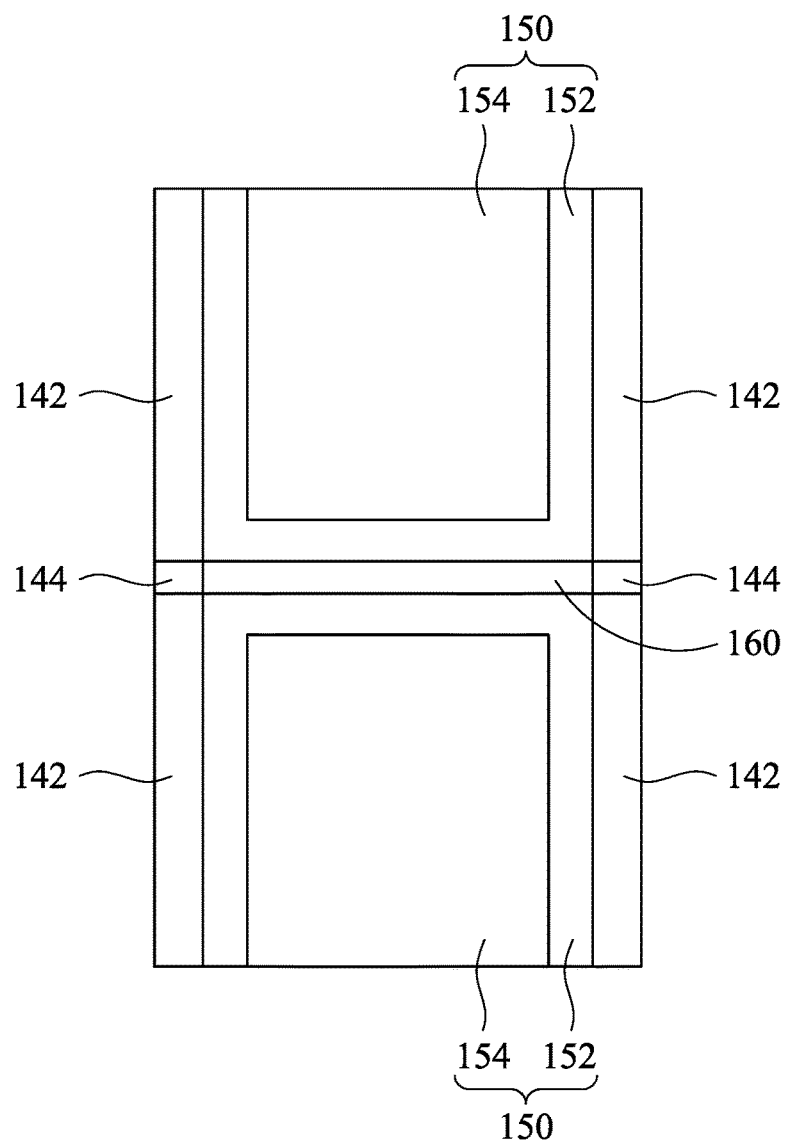
FIG. 1B is a schematic top view of a FinFET device in accordance with some embodiments of the present disclosure.

Referring to FIG. 1A and FIG. 1B simultaneously, FIG. 1B is a schematic top view of the FinFET device 100. The spacers 140 include first portions 142 contacting the gate stacks 150 and a second portion 144 contacting the gate isolation structure 160. The first portions 142 sandwich the second portion 144. The material of the first portions 142 of the spacers 140 is different from the material of the second portion 144 of the spacers 140. In some embodiments, the first portions 142 of the spacers 140 are oxide of the second portion 144 of the spacers 140. For example, the second portion 144 of the spacers 140 is formed from silicon nitride, and the first portions 142 of the spacers 140 are formed from an oxide of silicon nitride. However, embodiments of the present disclosure are not limited thereto. In some embodiments, the second portion 144 of the spacers 140 is formed from silicon carbide, and the first portions 142 of the spacers 140 are formed from an oxide of silicon carbide.

Because the first portions 142 of the spacers 144 are oxide of the second portion 144 of the spacers 140, a dielectric constant of the first portions 142 of the spacers 140 is lower than a dielectric constant of the second portion 144 of the spacers 140. Therefore, parasitic capacitance between the gate stacks 150 and contacts on the sources/drains 170 can be reduced.

Figure 1C:
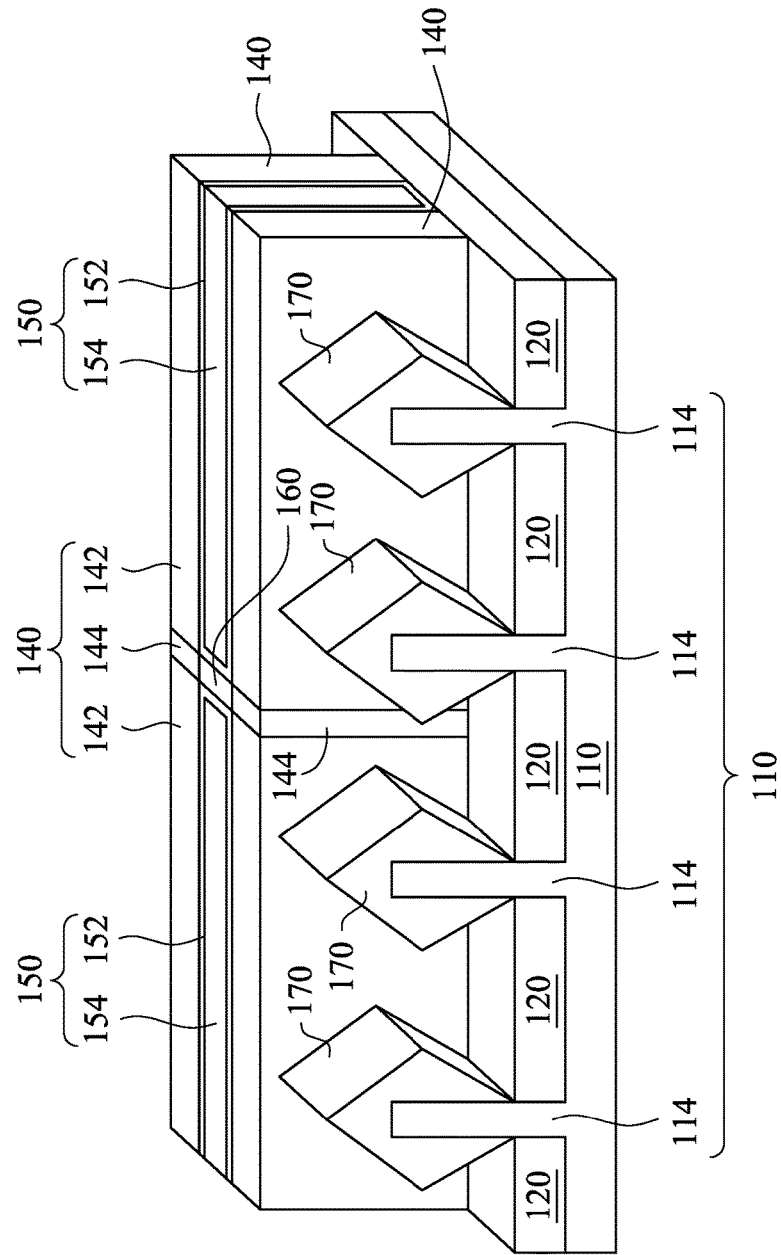
FIG. 1C is a schematic three-dimensional diagram showing a FinFET device in accordance with some embodiments of the present disclosure.

In addition, although the FinFET device 100 includes the dielectric layer 130, the dielectric layer 130 can be omitted in some embodiments of the present disclosure. For example, as shown in FIG. 1C, the dielectric layer 130 is omitted.

Figure 2A:
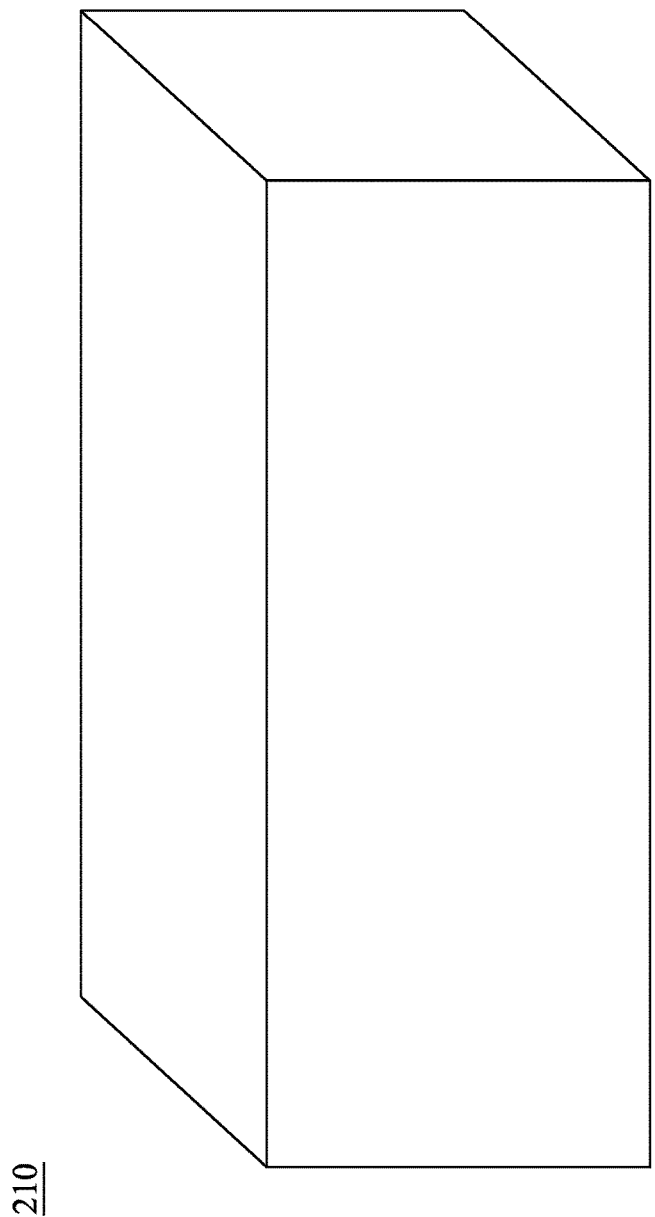
FIG. 2A to FIG. 2K are cross-sectional views of intermediate stages showing a method for fabricating a FinFET device in accordance with some embodiments of the present disclosure.

Referring to FIG. 2A to FIG. 2K, FIG. 2A to FIG. 2K are schematic three-dimensional diagrams of intermediate stages showing a method for fabricating a FinFET device in accordance with some embodiments of the present disclosure. As shown in FIG. 2A, a semiconductor substrate 210 is provided at first. The semiconductor substrate 210 may be a semiconductor material and may include structures including a graded layer or a buried oxide, for example. In some embodiments, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 210 may be an active layer of a semiconductor-on-insulator (SOI) substrate or a multi-layered structure such as a silicon-germanium layer formed on a bulk silicon layer.

Figure 2B:
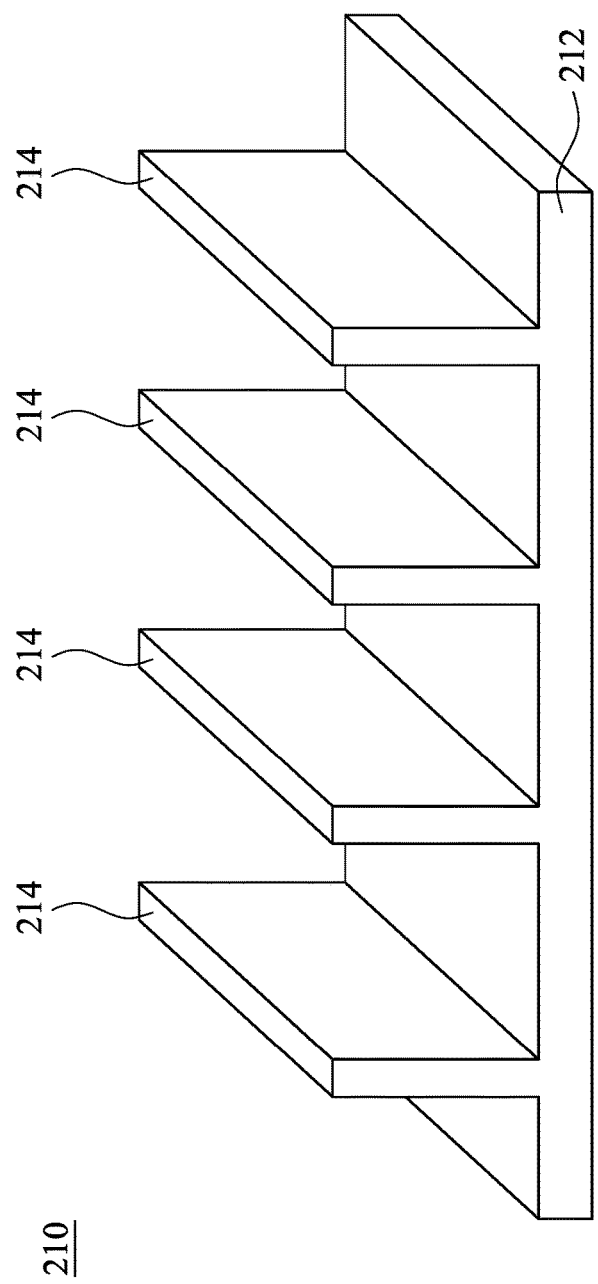

Then, the semiconductor substrate 210 is etched to form at least one fin. As shown in FIG. 2B, the semiconductor substrate 210 is etched to form plural fins 214 in a bottom 212. The fins 214 can be formed by a wet etching operation or a dry etching operation. However, embodiments of the present disclosure are not limited thereto.

Figure 2C:
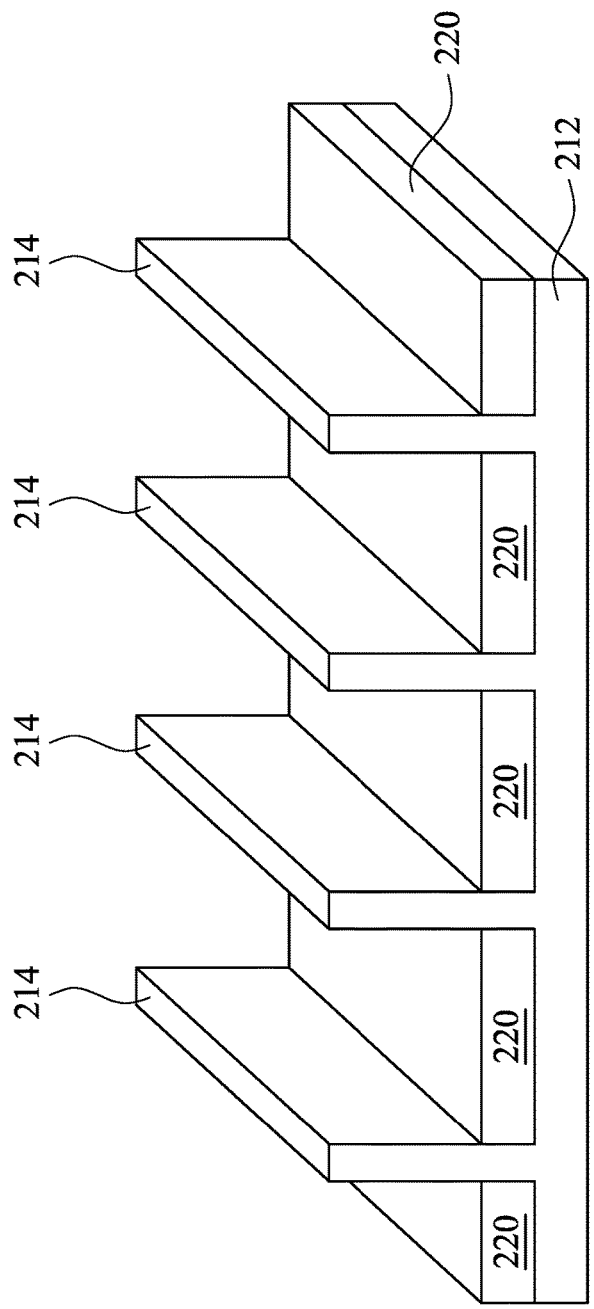

Thereafter, as shown in FIG. 2C, device isolation structures 220 are formed on the bottom 212 of the semiconductor substrate 210. In some embodiments, the device isolation structures 220 can be shallow trench isolations and formed by chemical vapor deposition (CVD) techniques using tetra-ethyl-ortho-silicate (TEOS) and oxygen as a precursor. However, embodiments of the present disclosure are not limited thereto.

Figure 2D:
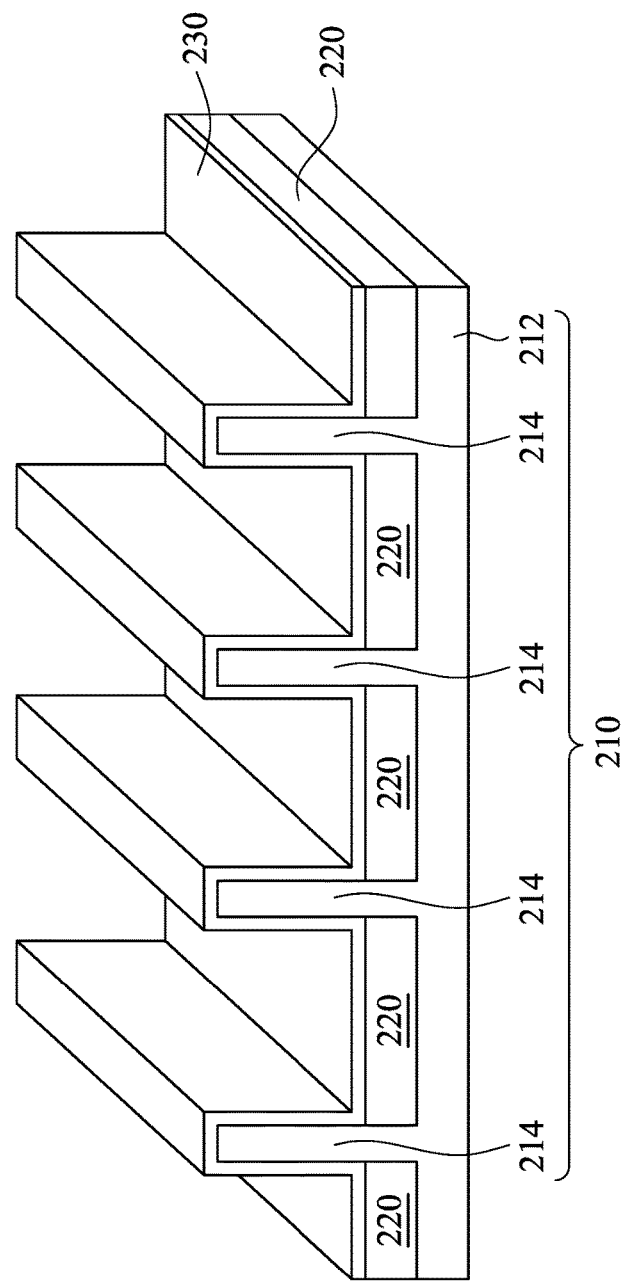

Then, as shown in FIG. 2D, a dielectric layer 230 is formed on the substrate 210 to cover the fins 214. The dielectric layer 230 is conformal to the fins 214. The dielectric layer 230 can be formed through a operation such as chemical vapor deposition (CVD), plasma enhanced chemical vapor deposition (PECVD), or low pressure chemical vapor deposition (LPCVD). However, embodiments of the present disclosure are not limited thereto.

Figure 2E:
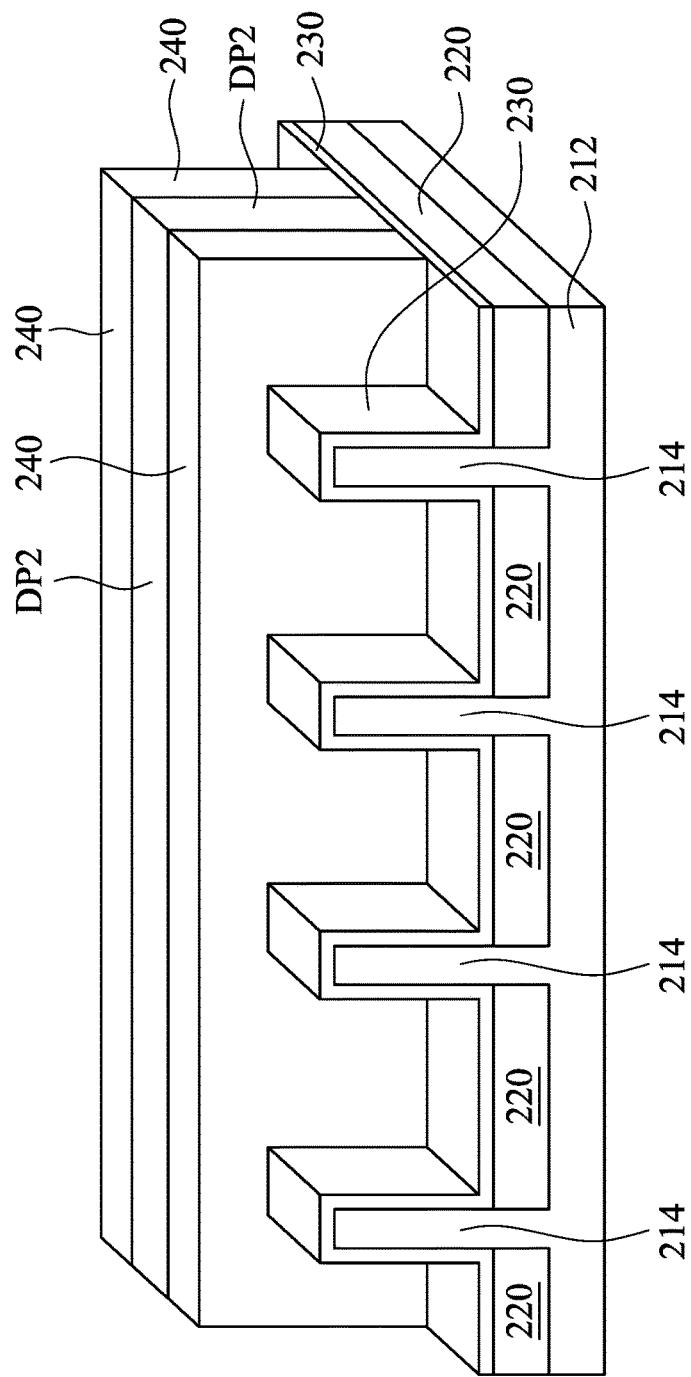

Thereafter, as shown in FIG. 2E, spacers 240 and a main dummy gate stack DP2 are formed on the dielectric layer 230, in which the main dummy gate stack DP2 is formed between the spacers 240. In some embodiments, the main dummy gate stack DP2 is formed at first, and then the spacers 240 are formed on sidewalls of the main dummy gate stack DP2. In some embodiments, the spaces 240 are formed from silicon nitride or silicon carbide, and the main dummy gate stack DP2 is formed from poly-silicon. However, embodiments of the present disclosure are not limited thereto.

Figure 2F:
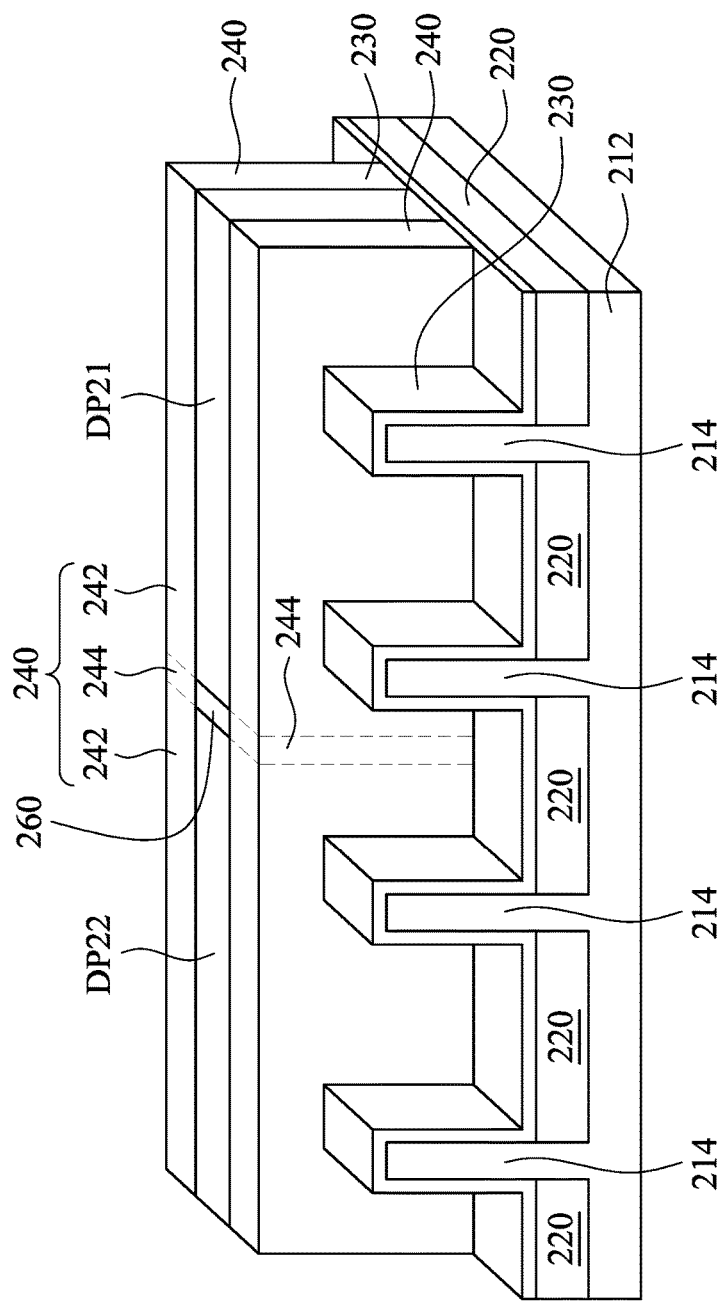

Then, as shown in FIG. 2F, an gate isolation structure 260 is formed between the spacers 240 to divide the main dummy gate stack DP2 into a dummy gate stack DP21 and a dummy gate stack DP22, and thus a dummy gate structure including the spacers 240, the dummy gate stacks DP21 and DP22 and the gate isolation structure 260 is formed over the dielectric layer 230 and crosses the fins 214. In the dummy gate structure, the gate isolation structure 260 is adjoining the dummy gate stacks DP21 and DP22, and the spacers 240 sandwich the dummy gate stacks DP21 and DP22 and the gate isolation structure 260. At operation forming the gate isolation structure 260, the main dummy gate stack DP2 is etched to form a gap, and the dummy gate stacks DP21 and DP22 are defined accordingly. For example, the gap is located between the dummy gate stacks DP21 and DP22. Then, the gate isolation structure 260 is formed in the gap to isolate the dummy gate stacks DP21 and DP22 from each other. In some embodiments, the gate isolation structure 260 is formed from nitride, but embodiments of the present disclosure are not limited thereto.

After the formation of the gate isolation structure 260, a first portion 242 and a second portion 244 of the spacers 240 can be defined. For example, a portion contacting the dummy gate stacks DP21 and DP22 is defined as the first portion 242 of the spacers 240, and another portion contacting the gate isolation structure 260 is defined as the second portion 244 of the spacers 240.

Figure 2G:
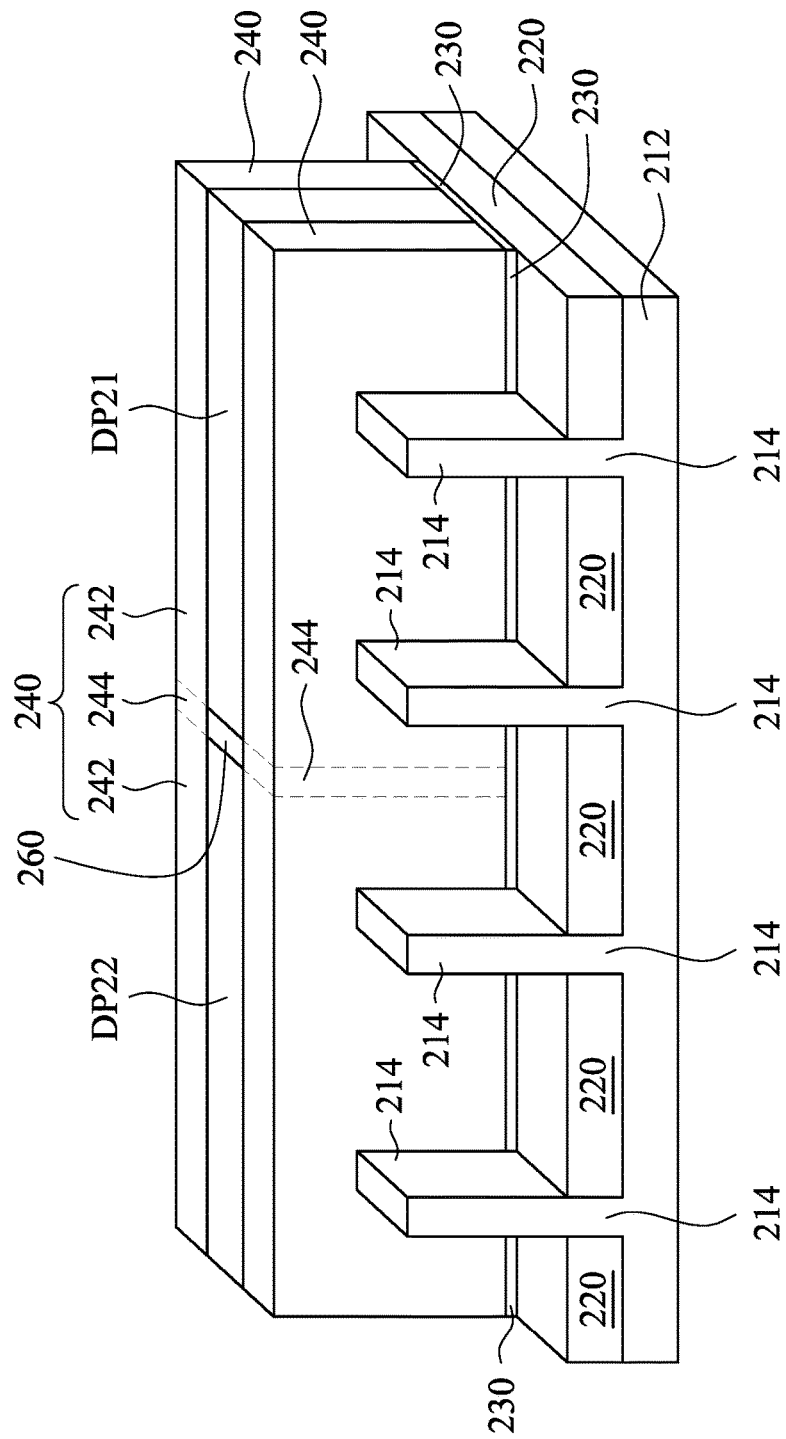
Figure 2H:
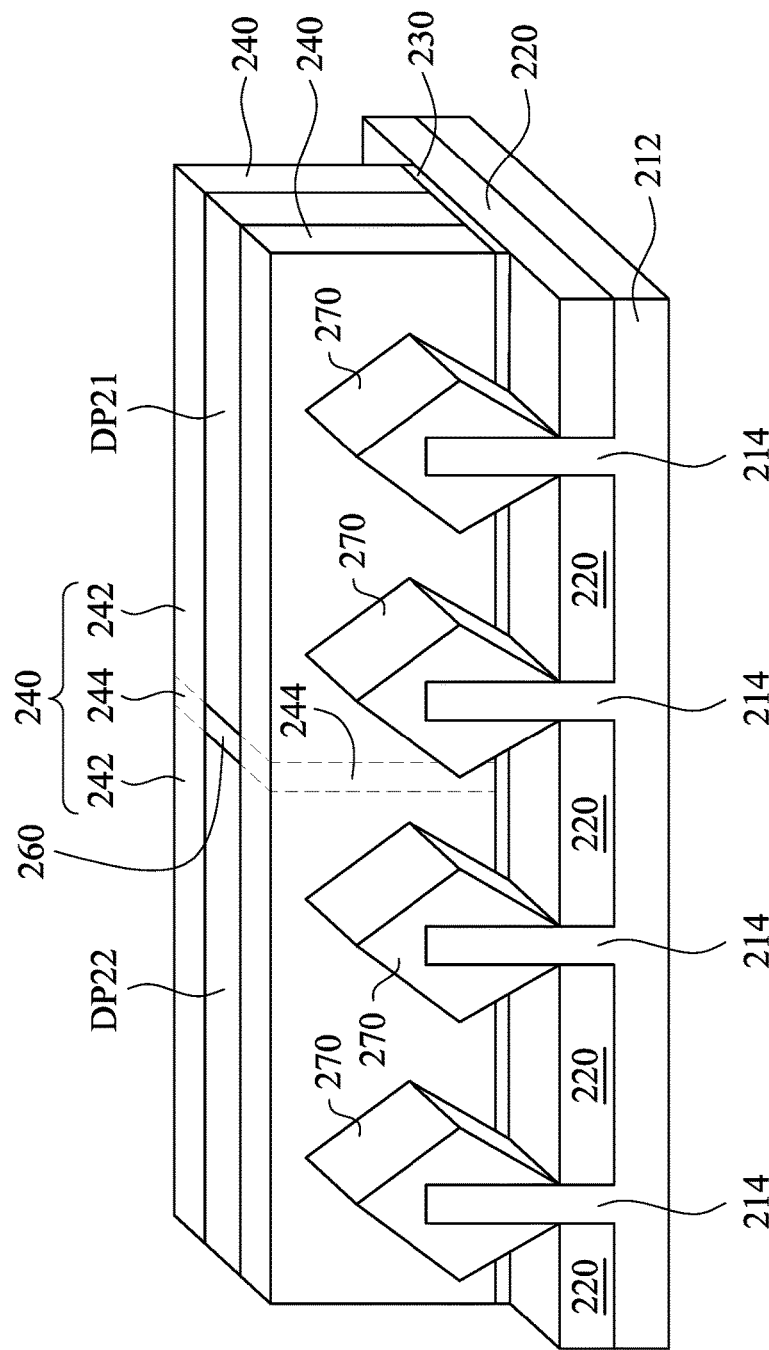

Thereafter, as shown in FIG. 2G, portions of the dielectric layer 230 are etched to expose portions of the fins 214. Then, as shown in FIG. 2H, sources/drains 270 are formed on the exposed surfaces of the fins 214 and cover the fins 214. In some embodiments, the sources/drains 270 are formed from silicon germanium and epitaxially grown from a surface of the fins 214, but embodiments of the present disclosure are not limited thereto. In some embodiments, a doping operation is conducted on the sources/drains 270 to dope the sources/drains 270 with an n-type or p-type dopant.

Figure 2I:
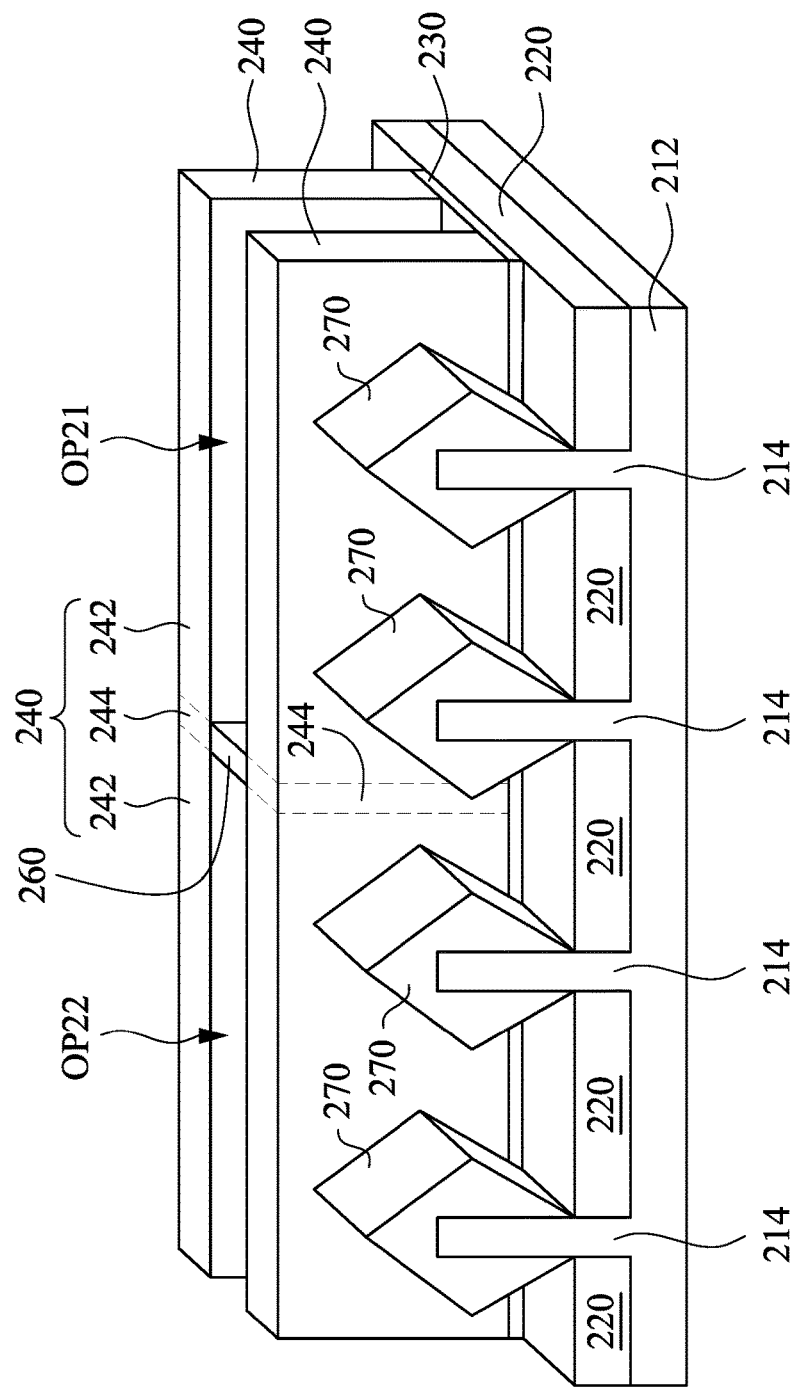

Thereafter, as shown in FIG. 2I, the dummy gate stacks DP21 and DP22 are removed to form openings OP21 and OP22, thereby exposing portions of the dielectric layer 230.

Figure 2J:
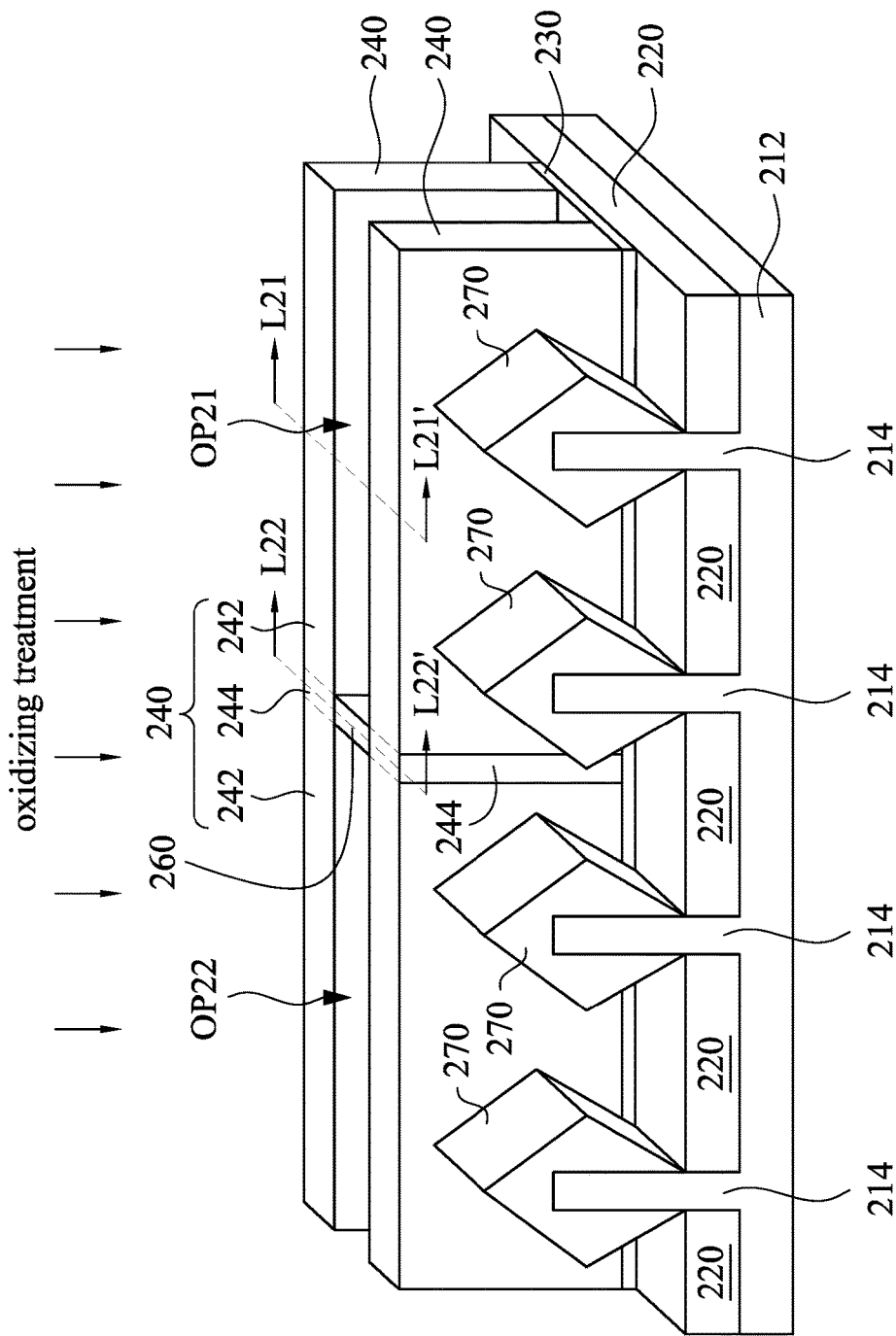
Figure 2J:
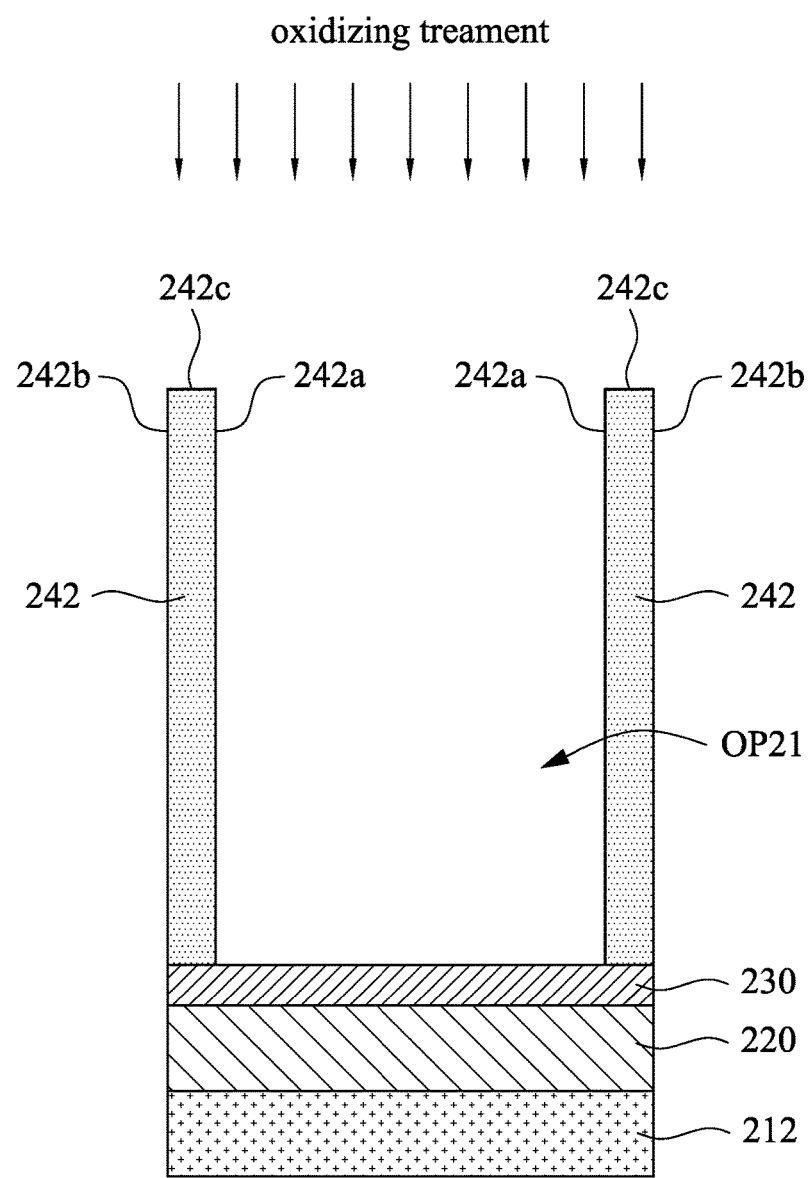

Then, as shown in FIG. 2J, an oxidizing treatment is conducted on the exposed portions of the dielectric layer 230 and the first portion 242 of the spacers 240. Referring to FIG. 2J' and FIG. 2J", FIG. 2J' is a cross-sectional view of the FinFET device viewed along line L21-L21' in FIG. 2J, and FIG. 2J" is a cross-sectional view of the FinFET device viewed along line L22-L22' in FIG. 2J. When the oxidizing treatment is conducted, with respect to the first portion 242 of the spacers 240, inner sides 242a, outer sides 242b and top sides 242c of the first portion 242 are oxidized, and thus the first portion 242 is oxidized to form an oxidized spacer portion 242', as shown in FIG. 2J'. However, when the oxidizing treatment is conducted, with respect to the second portion 244 of the spacers 240, the inner sides 244a, the outer sides 244b and the top sides 244c of the second portion 244 are not significantly oxidized because the inner sides 244a of the second portion 244 of the spacers 240 are covered by the gate isolation structure 260, as shown in FIG. 2J".

Therefore, after the oxidizing treatment is conducted, a dielectric constant of the oxidized spacer portion 242' is lower than a dielectric constant of the second portion 244 of the spacers 240 because the second portion 244 of the spacers 240 is not significantly oxidized.

In some embodiments, the oxidizing treatment includes a reduction operation and an oxidizing operation. In the oxidizing treatment, the reduction operation is conducted on the spacers 240 and the dielectric layer 230 at first, and then the oxidizing operation is conducted on the spacers 240 and the dielectric layer 230. In some embodiments, the reduction operation reduces the spacers 240 and the dielectric layer 230 by using hydrogen at a temperature of 300° C. In some embodiments, the oxidizing operation conducted after the reduction operation is a plasma oxidation operation, and the plasma oxidation operation is conducted at a temperature lower than 600° C. However, embodiments of the present disclosure are not limited thereto.

Figure 2K:
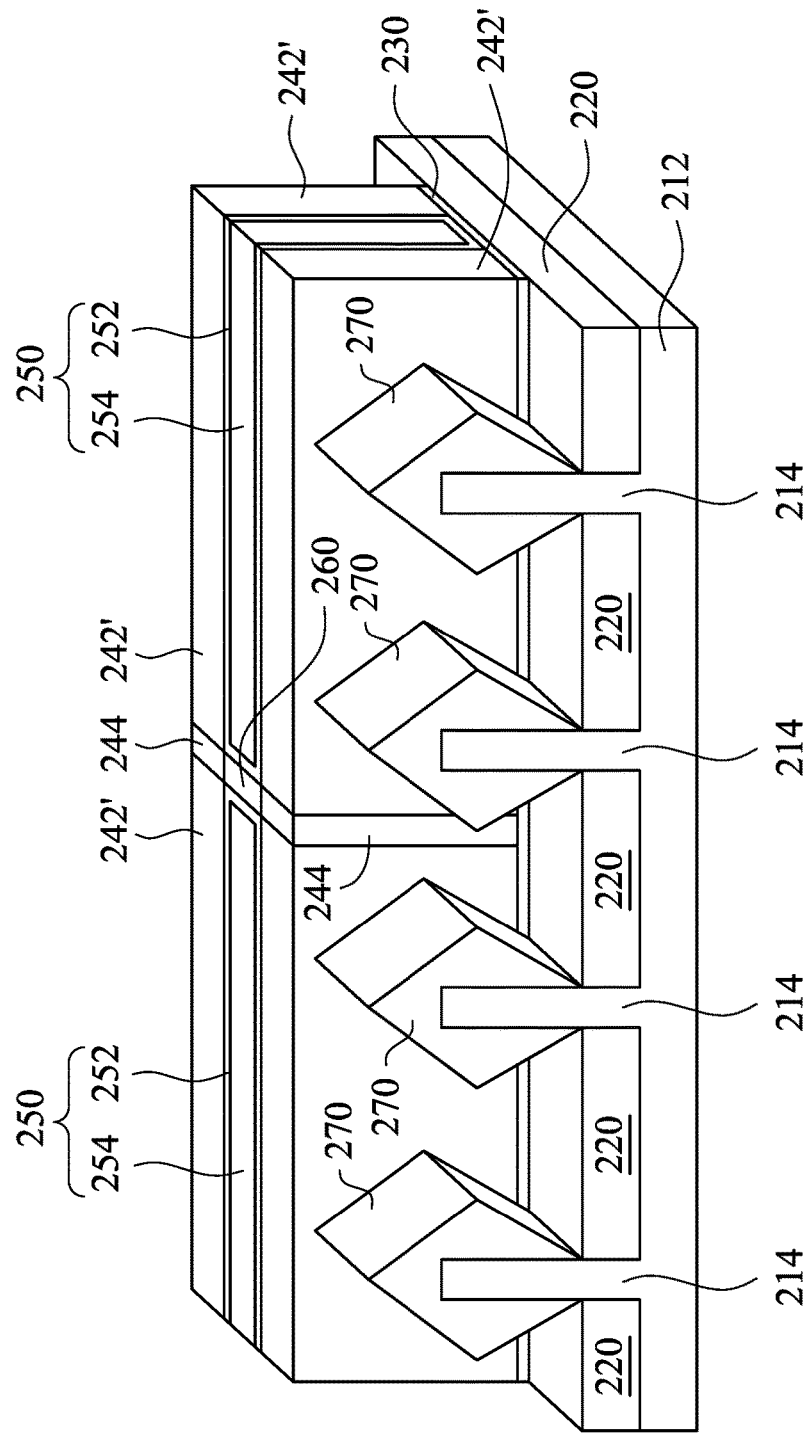

Thereafter, as shown in FIG. 2K, gate stacks 250 are formed in the openings OP21 and OP22 defined by the oxidized spacer portion 242'. In some embodiments, the gate stacks 250 are high-k metal gate structures. For example, each of the gate stacks 250 includes a high-k dielectric layer 252 and a metal gate electrode 254. However, embodiments of the present disclosure are not limited thereto.

Figure 3:
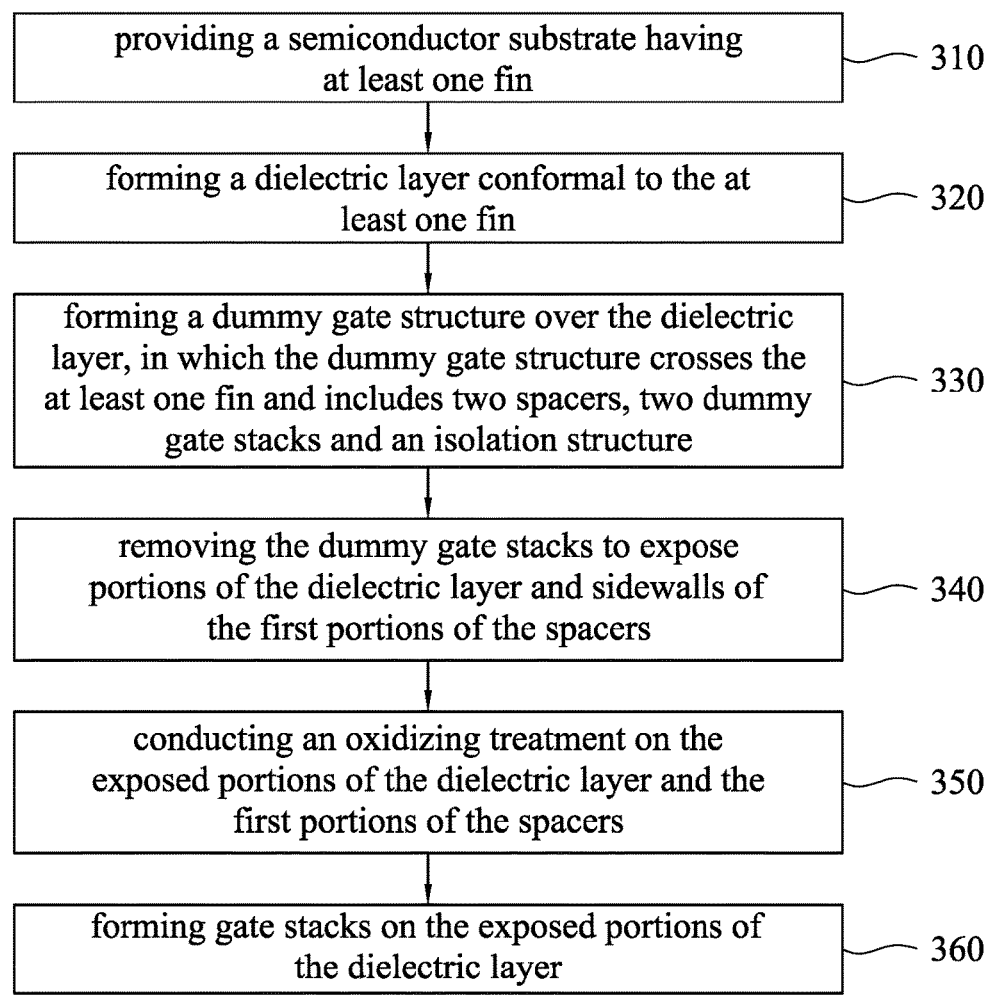
FIG. 3 is a flow chart showing a method for fabricating a FinFET device in accordance with embodiments of the present disclosure.

Referring to FIG. 3, FIG. 3 is a flow chart of a method 300 for manufacturing a FinFET device in accordance with an embodiment of the present disclosure. The method 300 begins at operation 310. At operation 310, the semiconductor substrate 210 is provided, in which the semiconductor substrate 210 includes the bottom 212 and the fins 214, as shown in FIG. 2A to FIG. 2B. Then, at operation 320, the dielectric layer 230 is formed on the substrate 210 and conformal to the fins 214, as shown in FIG. 2D. In some embodiments, between operation 310 and operation 320, an operation for forming the device isolation structures 220 on the bottom 212 of the semiconductor substrate 210 can be conducted, as shown in FIG. 2C.

Thereafter, at operation 330, a dummy gate structure is formed on the dielectric layer 230, as shown in FIG. 2E to FIG. 2F. For example, the main dummy gate stack DP2 is formed at first, and then the spacers 240 are formed on sidewalls of the main dummy gate stack DP2. Thereafter, the main dummy gate stack DP2 is etched to form a gap to define the dummy gate stacks DP21 and DP22, and then the gate isolation structure 260 is formed in the gap to isolate the dummy gate stacks DP21 and DP22 from each other. Therefore, the dummy gate structure including the spacers 240, the dummy gate stacks DP21 and DP22 and the gate isolation structure 260 is formed over the dielectric layer 230 and crosses the fins 214.

Then, at operation 340, the dummy gate stacks DP21 and DP22 are removed to expose portions of the dielectric layer 230 and sidewalls of the first portion 242 of the spacers 240, as shown in FIG. 2I. In some embodiments, operation for forming the sources/drains 270, as shown in FIG. 2G to FIG. 2H, can be conducted between operations 330 and 340. In some embodiments, a doping operation is conducted on the sources/drains 270 to dope the sources/drains 270 with an n-type or p-type dopant.

Thereafter, at operation 350, the oxidizing treatment is conducted on the exposed portions of the dielectric layer 230 and the first portion 242 of the spacers 240, as shown in FIG. 2J and FIG. 2J'.

Then, at operation 360, the gate stacks 250 are formed on the exposed portions of the dielectric layer 230, as shown in FIG. 2K.

Because the method 300 includes operation 350 for conducting the oxidizing treatment on the dielectric layer 230, damages caused by previous operations (for example, the operation for doping the sources/drains 270) is cured and the quality of the dielectric layer 230 is improved. Further, because the method 300 includes operation 350 for conducting the oxidizing treatment on the spacers 240, the dielectric constant of the first portion 242 of the spacers 240 is decreased to reduce the parasitic capacitance of the FinFET device.

Because of the quality improvements of the dielectric layer 230 used as a gate oxide, a breakdown voltage of the FinFET device fabricated by the method 300 and a so-called tailing of a gate leakage current are improved. In some embodiments, the breakdown voltage of the FinFET device is increased by 0.6-0.9 volts, and the tailing is reduced by 20%.

Figure 4A:
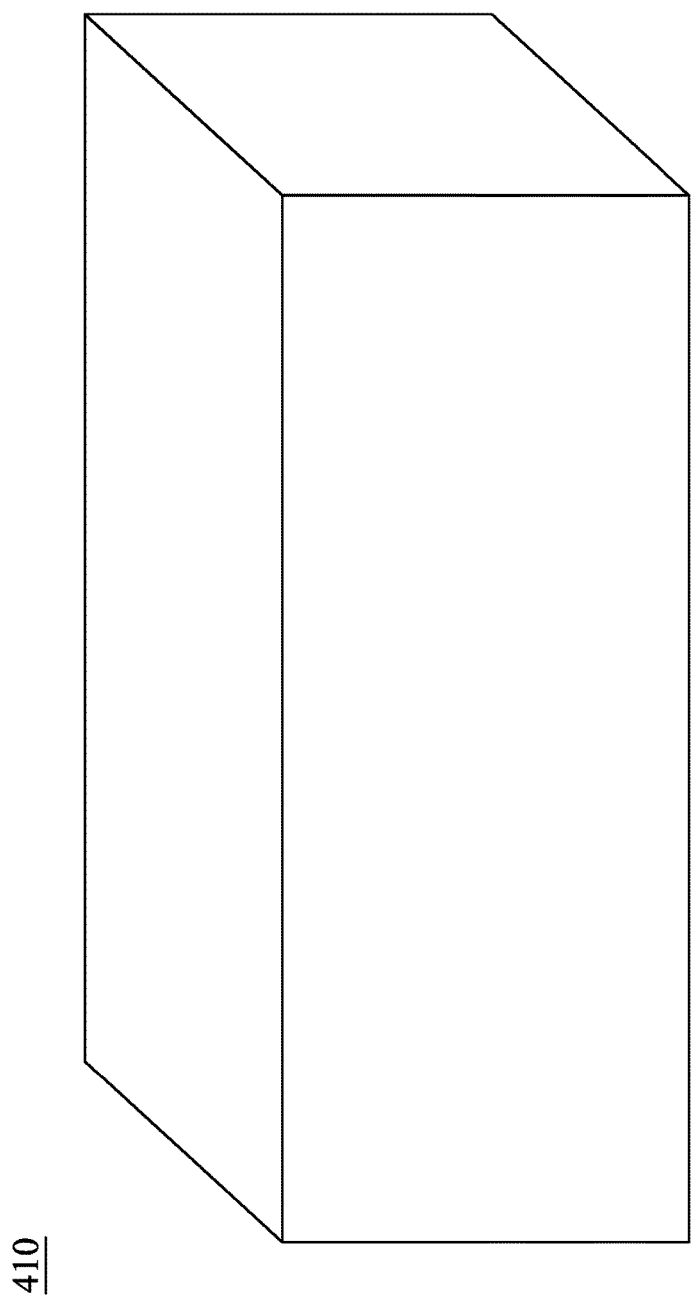
FIG. 4A to FIG. 4K and FIG. 4M are schematic three-dimensional diagrams of intermediate stages showing a method for fabricating a FinFET device in accordance with some embodiments of the present disclosure.

Referring to FIG. 4A to FIG. 4M, FIG. 4A to FIG. 4M are schematic three-dimensional diagrams of intermediate stages showing a method for fabricating a FinFET device in accordance with some embodiments of the present disclosure. As shown in FIG. 4A, a semiconductor substrate 410 is provided at first. The semiconductor substrate 410 may be a semiconductor material and may include structures including a graded layer or a buried oxide, for example. In some embodiments, the semiconductor substrate 410 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 410. Alternatively, the semiconductor substrate 410 may be an active layer of a semiconductor-on-insulator (SOI) substrate or a multi-layered structure such as a silicon-germanium layer formed on a bulk silicon layer.

Figure 4B:
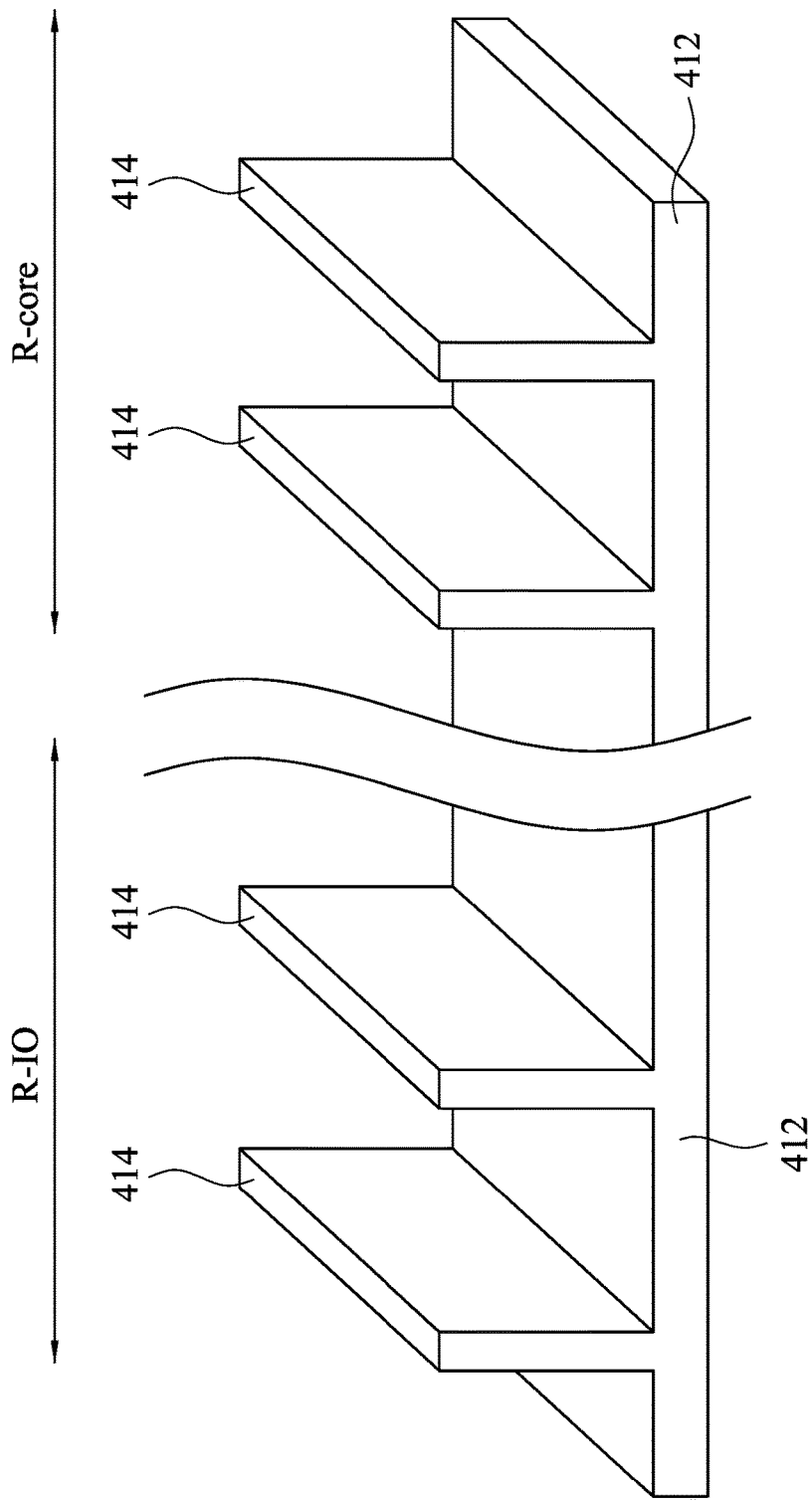

Then, the semiconductor substrate 410 is etched to form plural fins. As shown in FIG. 4B, the semiconductor substrate 410 is etched to form plural fins 414 in a bottom 412. The fins 414 can be formed by a wet etching operation or a dry etching operation. However, embodiments of the present disclosure are not limited thereto. In some embodiments, regions R-IO and R-core are defined in the semiconductor substrate 410. The semiconductor devices formed in the regions R-core are configured for core devices, and the semiconductor devices formed in the regions R-IO are configured for I/O devices. Therefore, the regions R-core are referred to as core regions and the regions R-IO are referred to as I/O regions. Further, the fins 414 in the region R-IO can be referred to as I/O fins, and the fins 414 in the region R-core can be referred to as core fins.

Figure 4C:
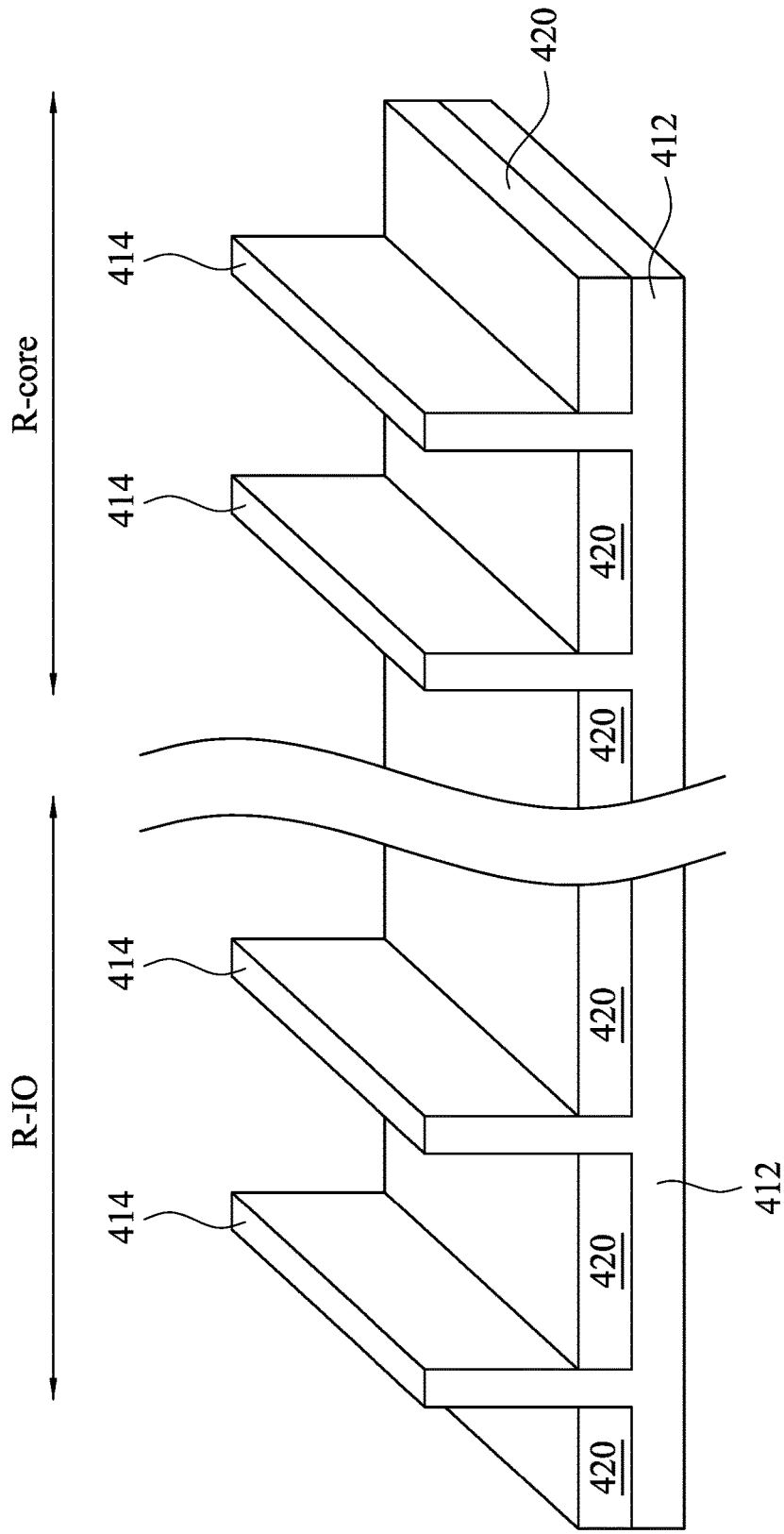

Thereafter, as shown in FIG. 4C, device isolation structures 420 are formed on the bottom 412 of the semiconductor substrate 410. In some embodiments, the device isolation structures 420 can be shallow trench isolations and formed by chemical vapor deposition (CVD) techniques using tetra-ethyl-ortho-silicate (TEOS) and oxygen as a precursor. However, embodiments of the present disclosure are not limited thereto.

Figure 4D:
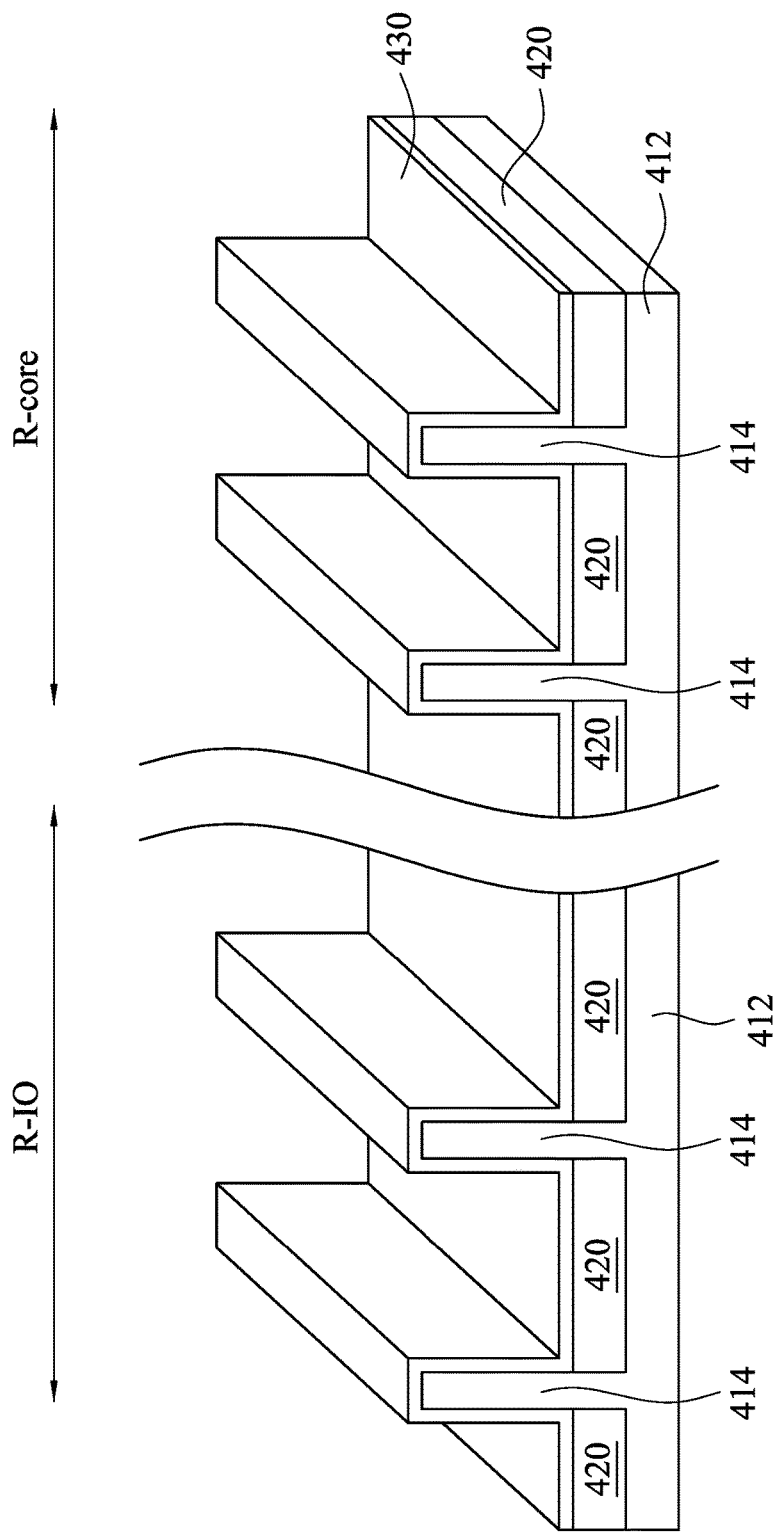

Then, as shown in FIG. 4D, a dielectric layer 430 is formed on the substrate 410 to cover the fins 414. The dielectric layer 430 is conformal to the fins 414. The dielectric layer 430 can be formed through a operation such as chemical vapor deposition (CVD), plasma enhanced chemical vapor deposition (PECVD), or low pressure chemical vapor deposition (LPCVD). However, embodiments of the present disclosure are not limited thereto.

Figure 4E:
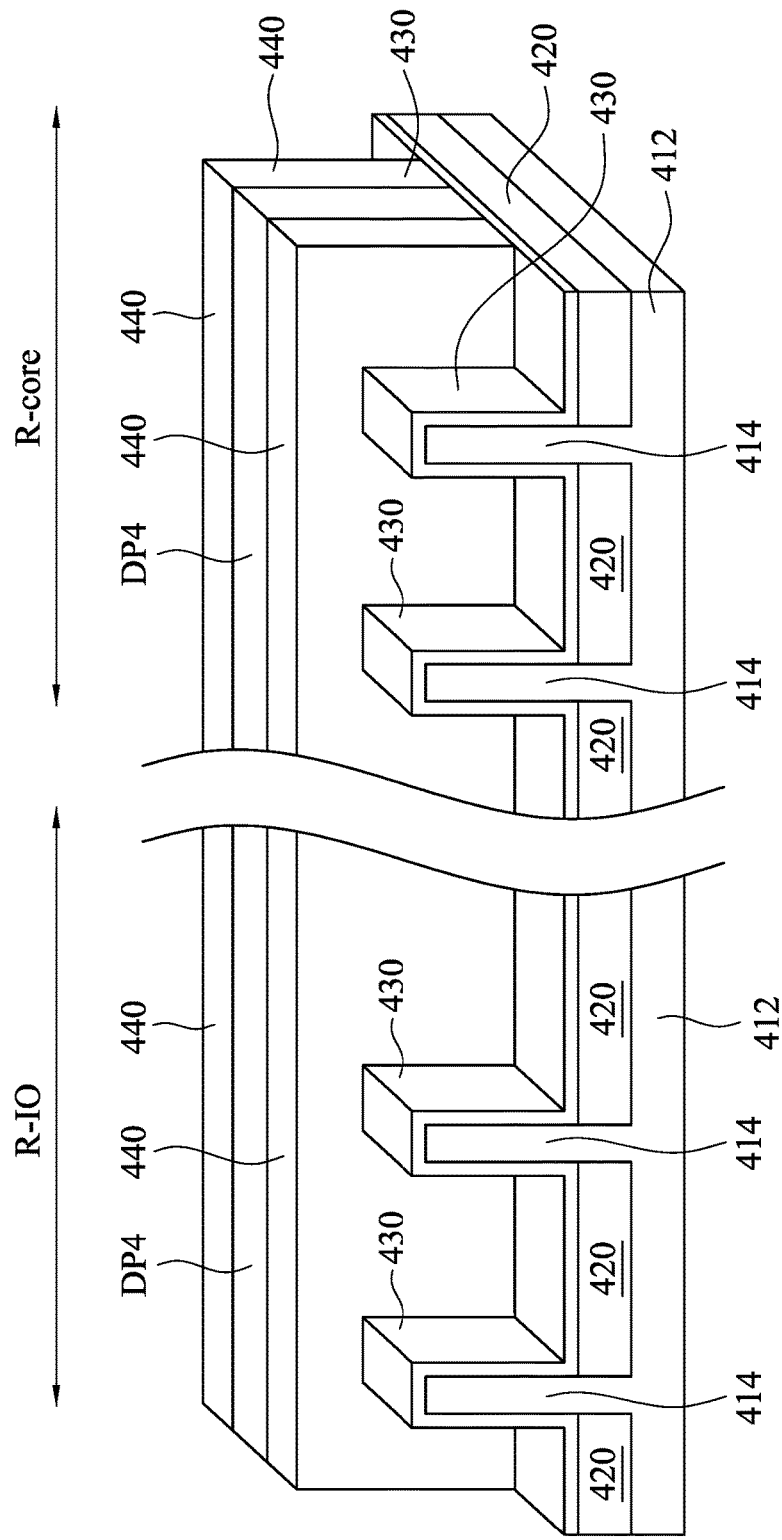

Thereafter, as shown in FIG. 4E, spacers 440 and a main dummy gate stack DP4 are formed on the dielectric layer 430, in which the main dummy gate stack DP4 is formed between the spacers 440. In some embodiments, the main dummy gate stack DP4 is formed at first, and then the spacers 440 are formed on sidewalls of the main dummy gate stack DP4. In some embodiments, the spaces 440 are formed from silicon nitride or silicon carbide, and the main dummy gate stack DP4 is formed from poly-silicon. However, embodiments of the present disclosure are not limited thereto.

Figure 4F:
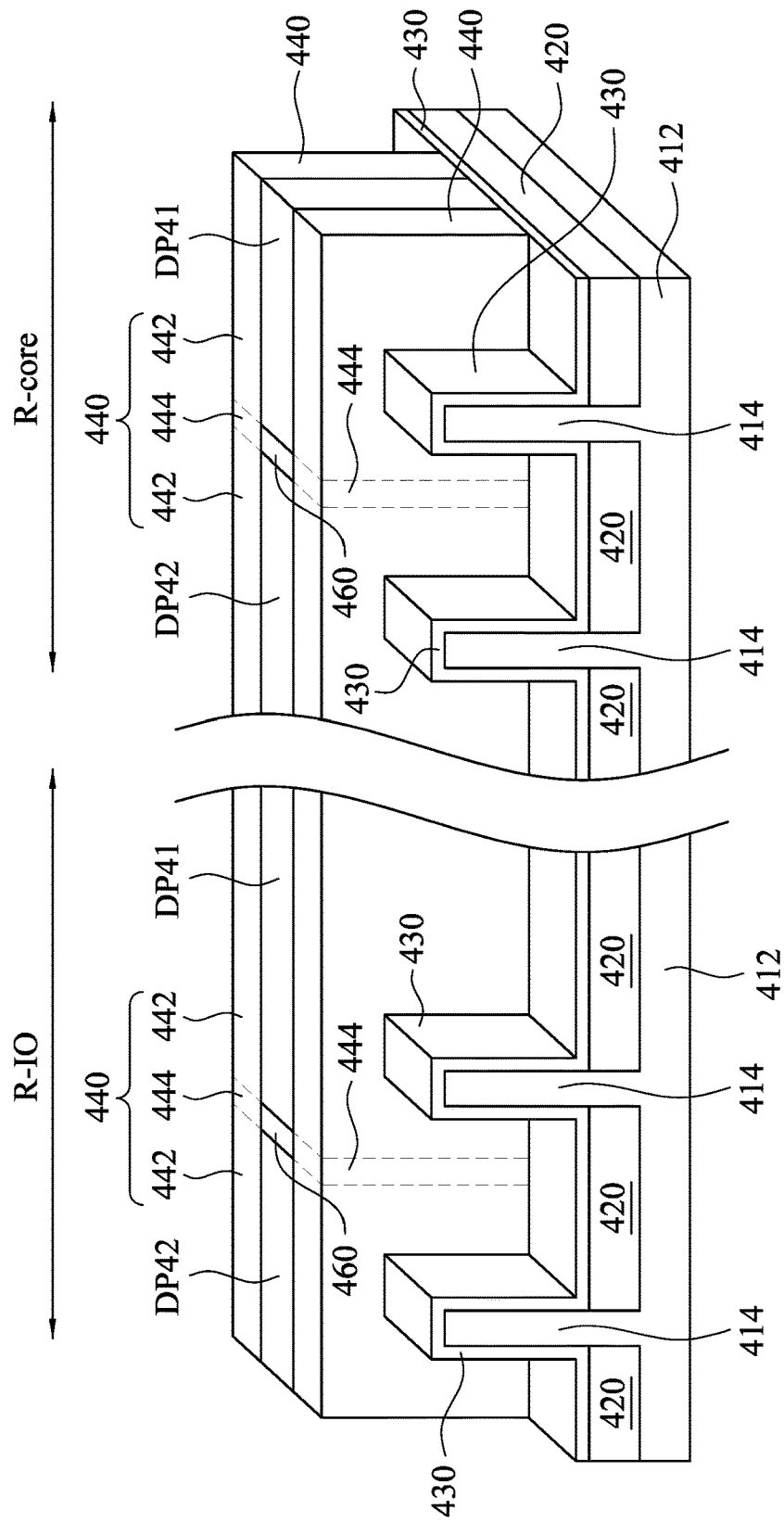

Then, as shown in FIG. 4F, gate isolation structures 460 are formed between the spacers 440 to divide the main dummy gate stack DP4 into dummy gate stacks DP41 and dummy gate stacks DP42.

For example, in the region R-core, the gate isolation structure 460 is formed between a portion of the spacers 440 to divide the main dummy gate stack DP4 into a dummy gate stack DP41 and a dummy gate stack DP42, and thus a core dummy gate structure including the portion of the spacers 440 in the region R-core, the dummy gate stacks DP41 and DP42 in the region R-core, and the gate isolation structure 460 in the region R-core is formed over the dielectric layer 430 and crosses the fins 414. In the core dummy gate structure, the gate isolation structure 460 is disposed between and adjoining the gate stacks 450 to isolate the gate stacks 450 from each other.

For another example, in the region R-IO, the gate isolation structure 460 is formed between a portion of the spacers 440 to divide the main dummy gate stack DP4 into a dummy gate stack DP41 and a dummy gate stack DP42, and thus a I/O dummy gate structure including the portion of the spacers 440 in the region R-IO, the dummy gate stacks DP41 and DP42 in the region R-IO, and the gate isolation structure 460 in the region R-IO is formed over the dielectric layer 430 and crosses the fins 414. In the I/O dummy gate structure, the gate isolation structure 460 is disposed between and adjoining the gate stacks 450 to isolate the gate stacks 450 from each other.

At operation forming the gate isolation structure 460, the main dummy gate stack DP4 is etched to form a gap in each of the regions R-core and R-IO, and the dummy gate stacks DP41 and DP42 are defined accordingly. For example, in each of the regions R-core and R-IO, the gap is located between the dummy gate stacks DP41 and DP42. Then, the gate isolation structures 460 are formed in the gaps to isolate the dummy gate stacks DP41 and DP42 from each other. In some embodiments, the gate isolation structures 460 are formed from nitride, but embodiments of the present disclosure are not limited thereto.

After the formation of the gate isolation structures 460, first portions 442 and second portions 444 of the spacers 440 can be defined. For example, the portions contacting the dummy gate stacks DP41 and DP42 are defined as the first portions 442 of the spacers 440, and the other portions contacting the gate isolation structures 460 are defined as the second portions 444 of the spacers 440.

Figure 4G:
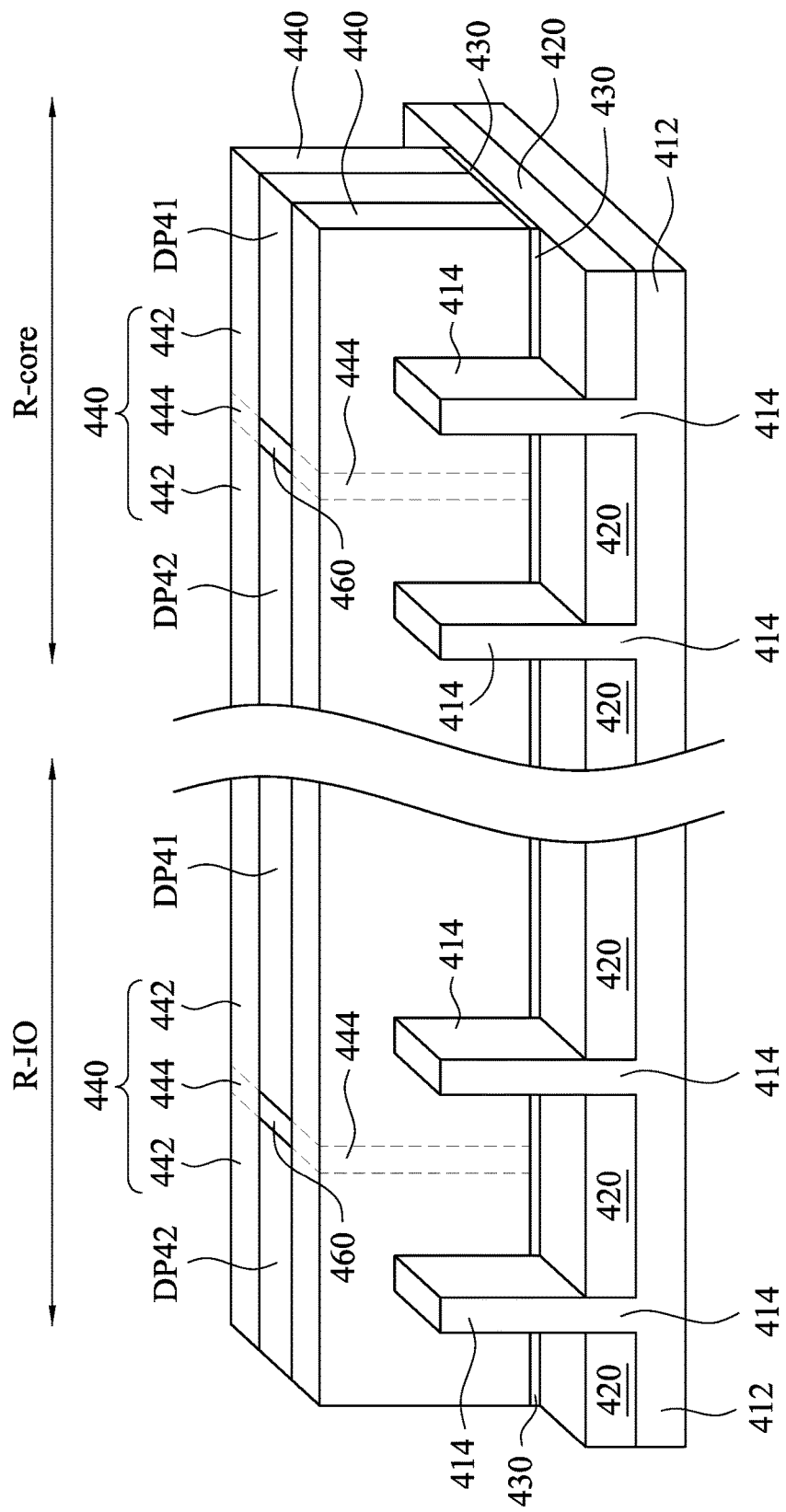
Figure 4H:
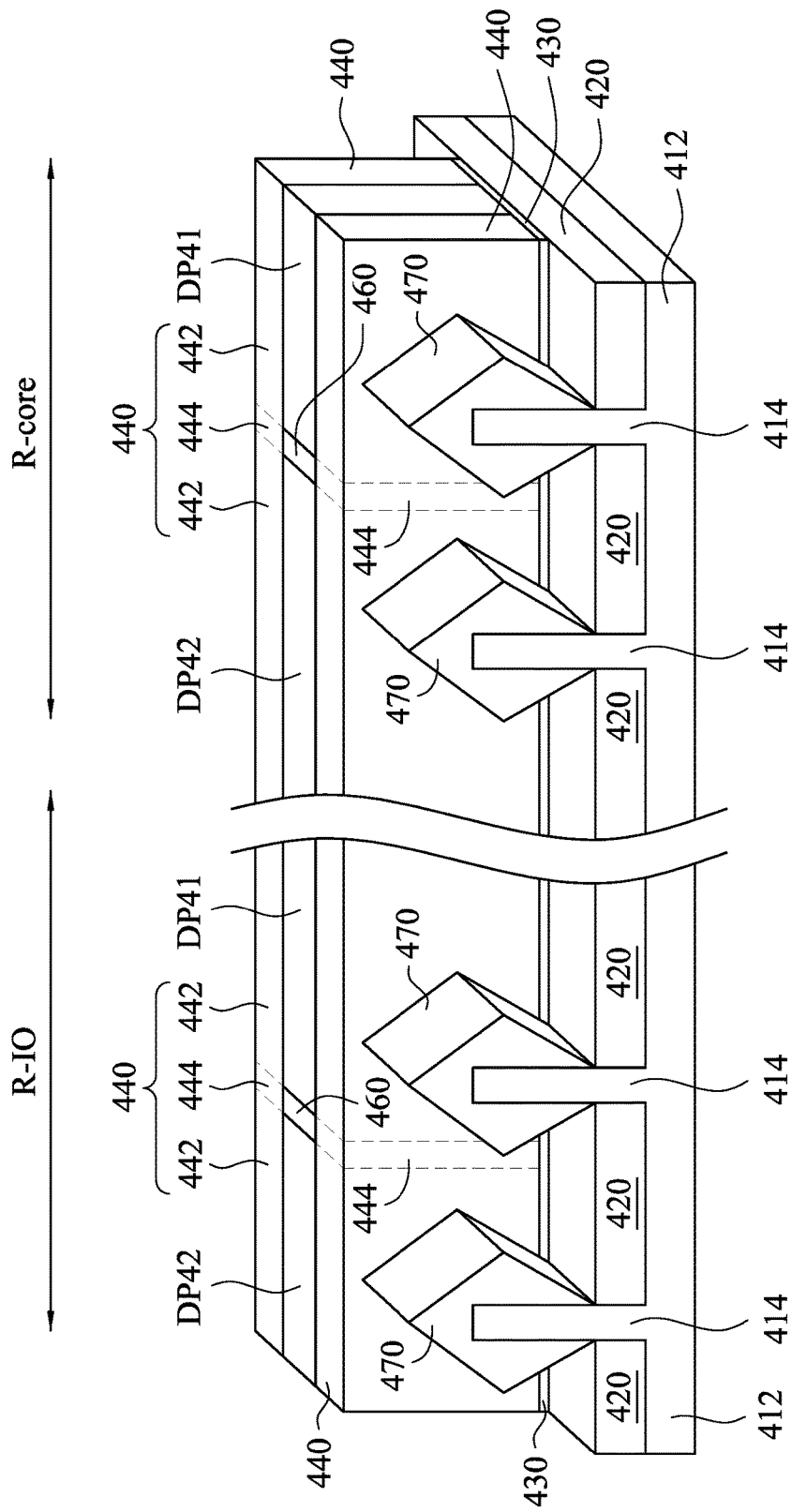
Figure 4I:
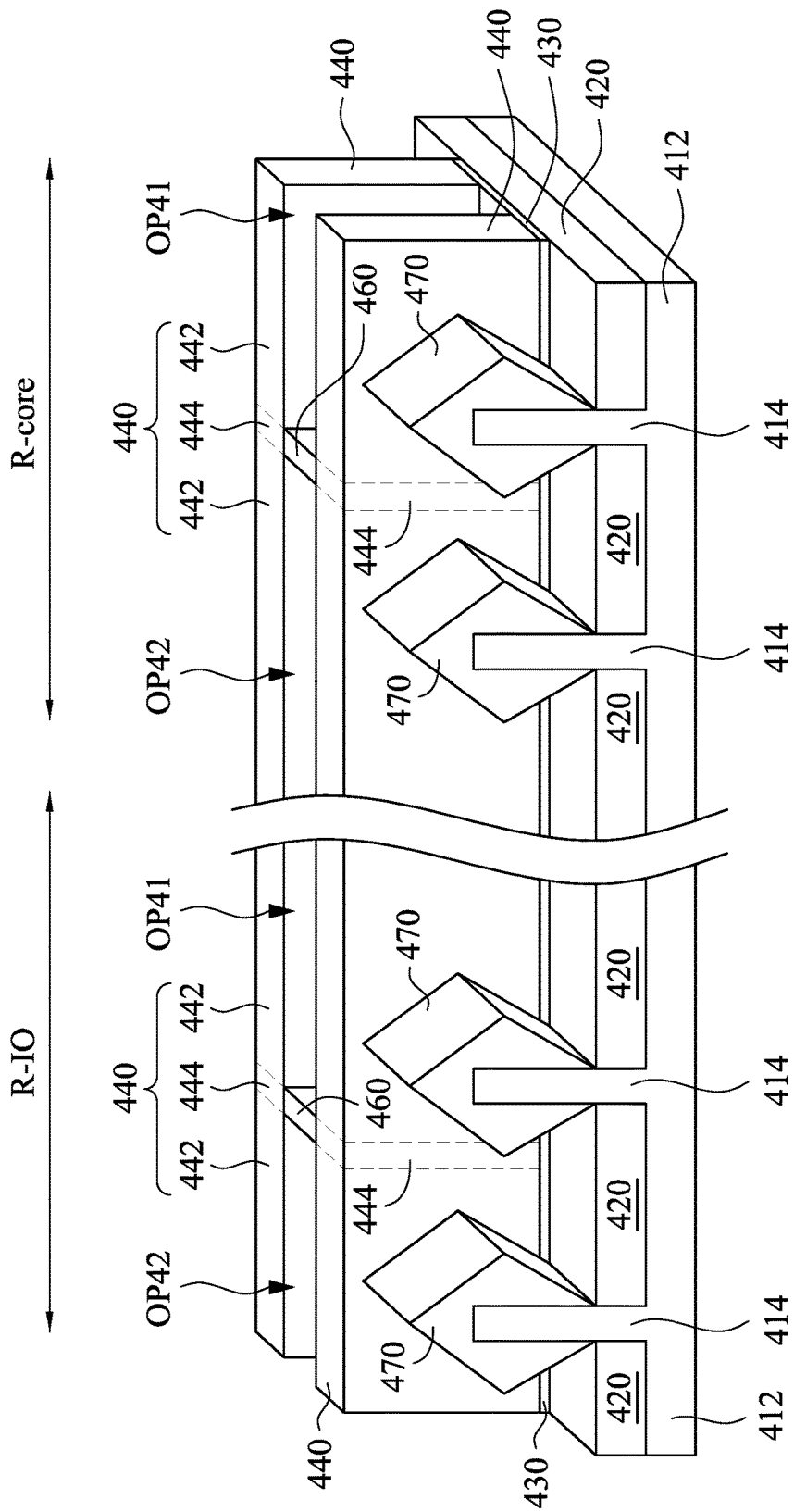

Thereafter, as shown in FIG. 4G, portions of the dielectric layer 430 are etched to expose portions of the fins 414. Then, as shown in FIG. 4H, sources/drains 470 are formed on the exposed surfaces of the fins 414 and cover the fins 414. In some embodiments, the sources/drains 470 are formed from silicon germanium and epitaxially grown from a surface of the fins 414, but embodiments of the present disclosure are not limited thereto. In some embodiments, a doping operation is conducted on the sources/drains 470 to dope the sources/drains 470 with an n-type or p-type dopant. Then, as shown in FIG. 4I, the dummy gate stacks DP41 and DP42 are removed to form openings OP41 and DP42, thereby exposing portions of the dielectric layer 430.

Figure 4J:
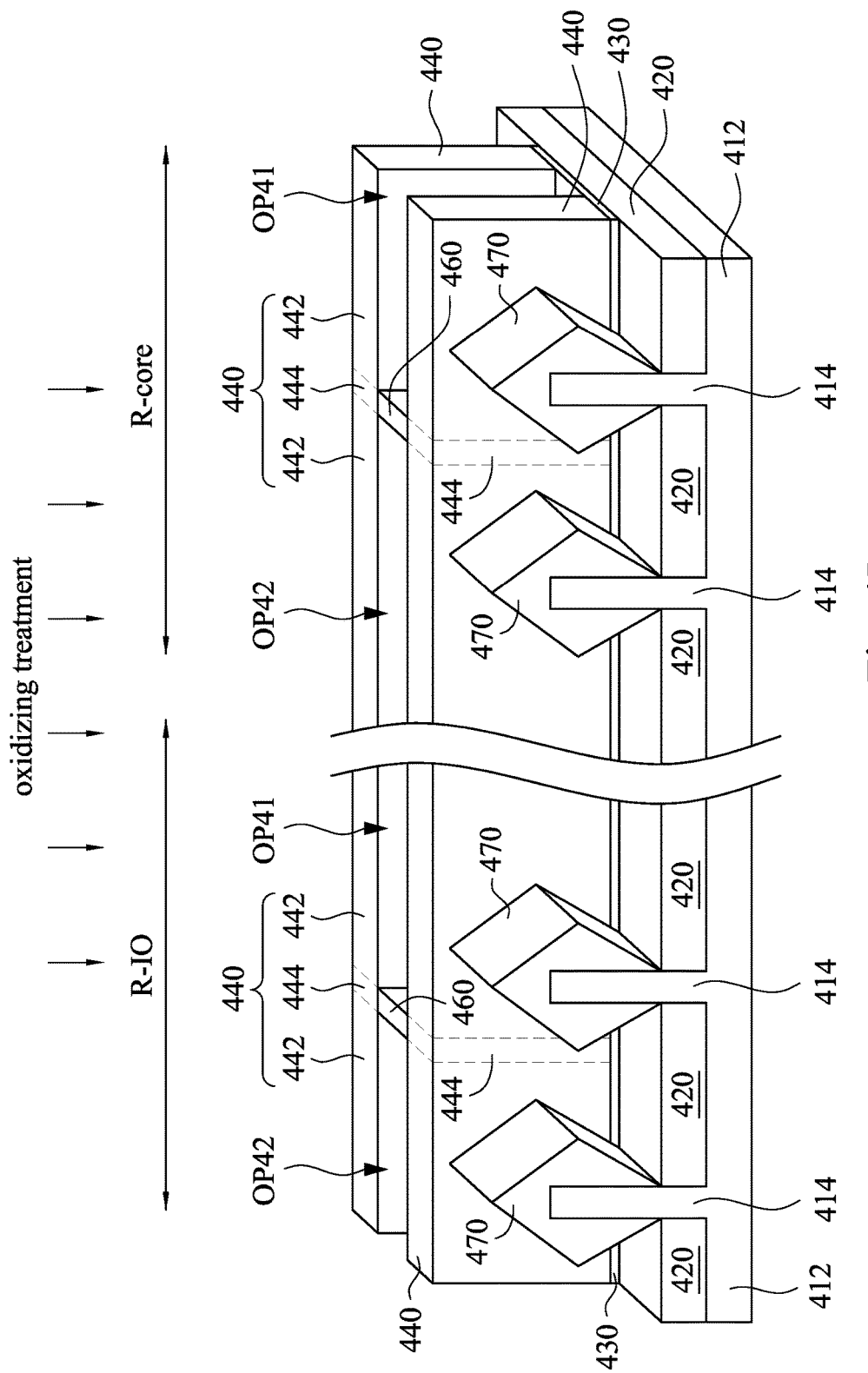

Then, as shown in FIG. 4J, an oxidizing treatment is conducted on the exposed portions of the dielectric layer 430 and the first portions 442 of the spacers 440. Similar to the oxidizing treatment conducted on the spacers 240 shown in FIG. 2J, FIG. 2J' and FIG. 2J", when the oxidizing treatment is conducted, with respect to the first portions 442 of the spacers 440, the inner sides, the outer sides and the top sides of the first portions 442 are oxidized, and thus the first portions 442 of the spacers 440 are oxidized to be oxidized spacer portions 442'. However, when the oxidizing treatment is conducted, with respect to the second portions 444 of the spacers 440, the inner sides, the outer sides and the top sides of the second portion 444 are not significantly oxidized because the inner sides of the second portions 444 of the spacers 440 are covered by the gate isolation structures 460.

Therefore, after the oxidizing treatment is conducted, a dielectric constant of the oxidized spacer portion 442' is lower than a dielectric constant of the second portion 444 of the spacers 440 because the second portion 444 of the spacers 440 is not significantly oxidized.

In some embodiments, the oxidizing treatment includes a reduction operation and an oxidizing operation. In the oxidizing treatment, the reduction operation is conducted on the spacers 440 and the dielectric layer 430 at first, and then the oxidizing operation is conducted on the spacers 440 and the dielectric layer 430.

Figure 4K:
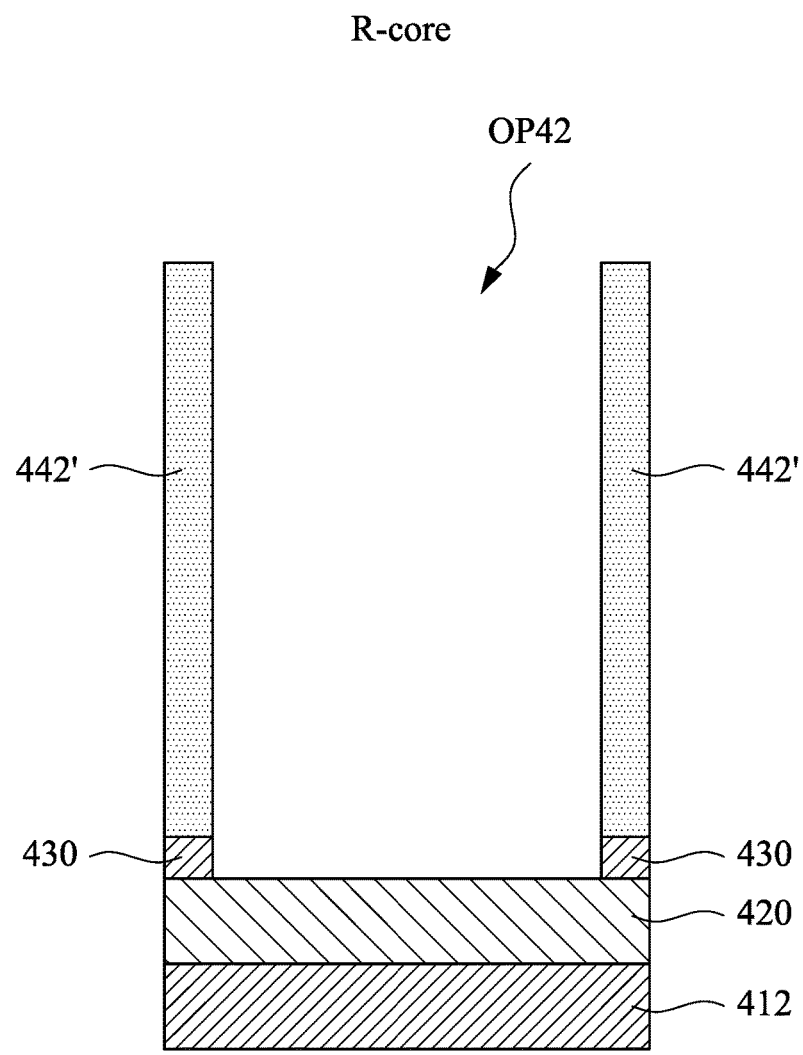

Thereafter, as shown in FIG. 4K, the exposed portions of the dielectric layer 430 corresponding to the core dummy gate structure are removed, thereby exposing the fins 414 located under the exposed portions of the dielectric layer 430.

Referring to FIG. 4K, FIG. 4K' and FIG. 4K" simultaneously, FIG. 4K' is a schematic cross-sectional view of the region R-core viewed along line L41-L41' in FIG. 4K, and FIG. 4K" is a schematic cross-sectional view of the region R-IO viewed along line L42-L42' in FIG. 4K. In the region R-core, the exposed portions of the dielectric layer 430 are removed, and portions of the fins 414 are exposed. However, in the region R-IO, the exposed portions of the dielectric layer 430 are not removed, and the fins 414 are covered by the dielectric layer 430. In some embodiments, a mask is formed to cover the structures in the region R-IO and the sources/drains 470 in the region R-core, thereby benefiting the removal of the exposed portions of the dielectric layer 430 in the region R-core.

Figure 4L:
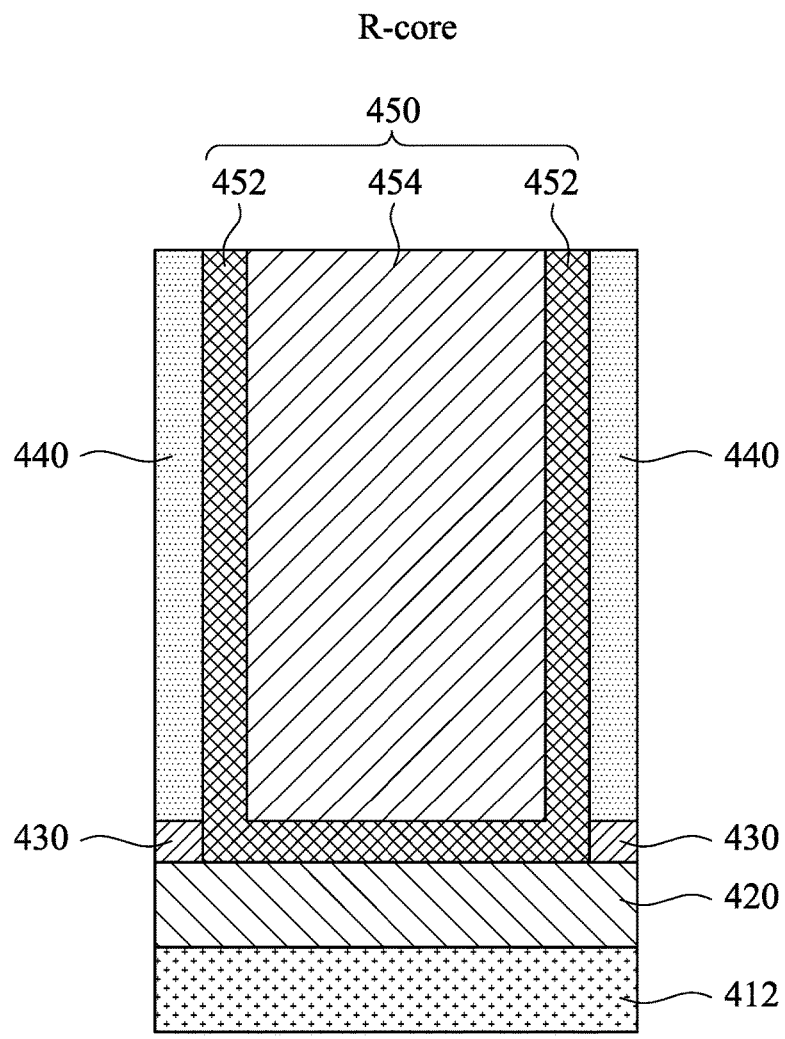
FIG. 4L' is a schematic cross-sectional view of the region R-core viewed along line L41-L41' in FIG. 4K.
Figure 4M:
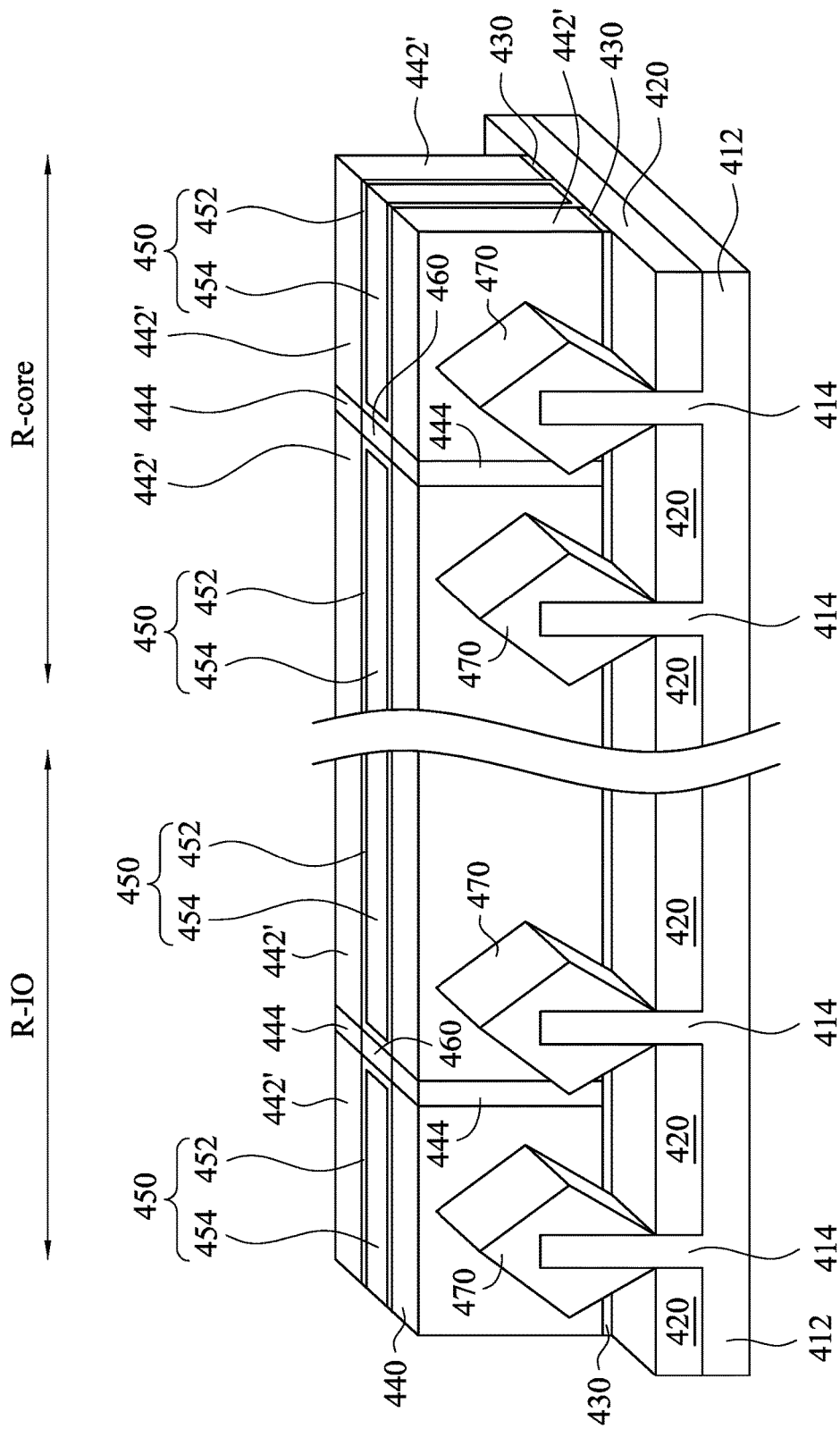

Thereafter, gate stacks 450 are formed in the openings OP41 and OP42, as shown in FIG. 4L' and FIG. 4L". In the region R-IO, the gate stacks 450 are disposed on the exposed portions of the dielectric layer 430 and contact the exposed portions of the dielectric layer. In the region R-core, the gate stacks 450 is disposed on the exposed portions of the fins 414 and contact the exposed portions of the fins 414. In some embodiments, the gate stacks 450 are high-k metal gate structures. For example, each of the gate stacks 450 includes a high-k dielectric layer 452 and a metal gate electrode 454. However, embodiments of the present disclosure are not limited thereto. Therefore, a semiconductor device as shown in FIG. 4M is obtained.

Figure 5:
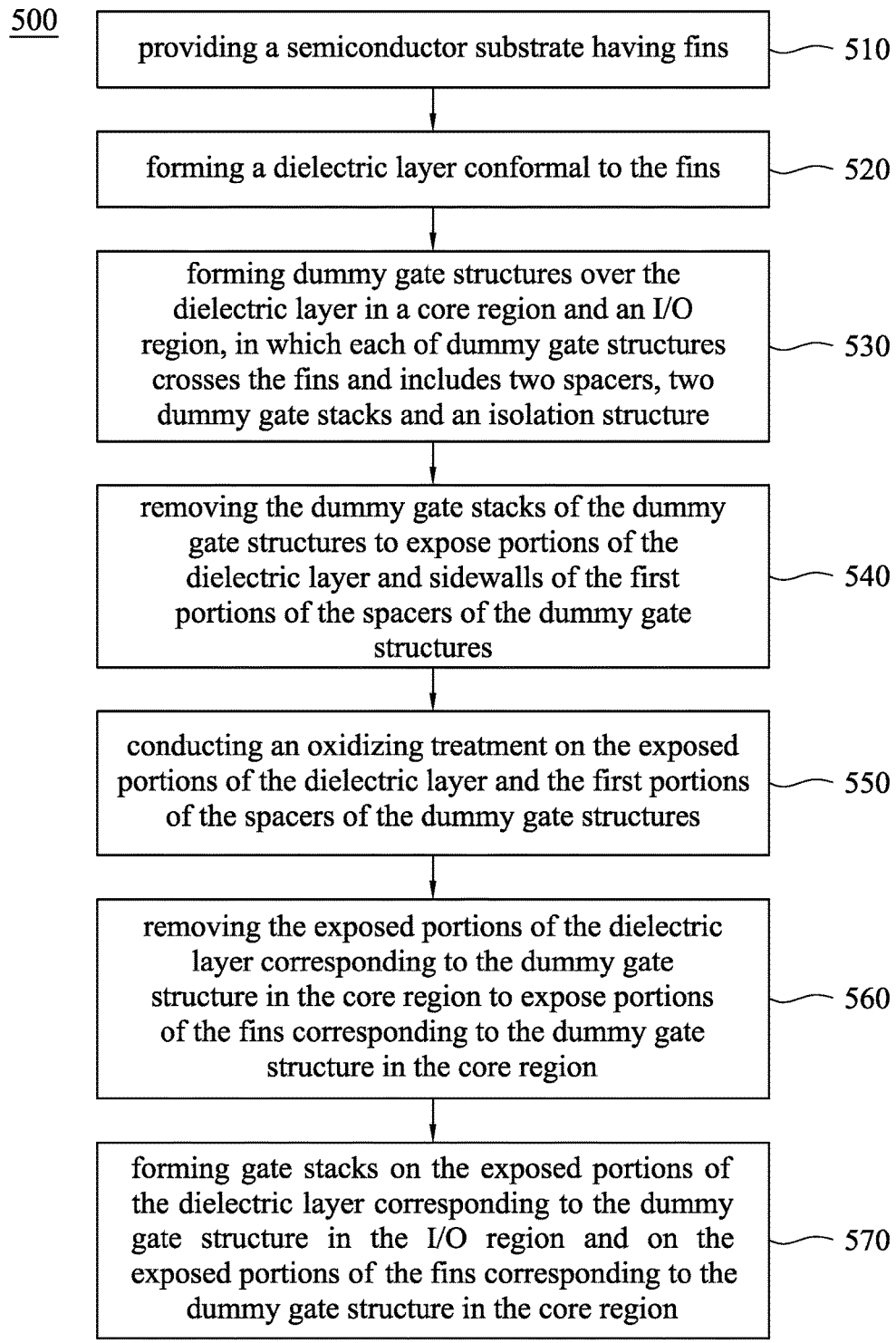
FIG. 5 is a flow chart of a method for manufacturing a FinFET device in accordance with an embodiment of the present disclosure.

Referring to FIG. 5, FIG. 5 is a flow chart of a method 500 for manufacturing a FinFET device in accordance with an embodiment of the present disclosure. The method 500 begins at operation 510. At operation 510, the semiconductor substrate 410 is provided, in which the semiconductor substrate 410 includes the bottom 412 and the fins 414, as shown in FIG. 4A to FIG. 4B. Then, at operation 520, the dielectric layer 430 is formed on the substrate 410, as shown in FIG. 4D. In some embodiments, between operation 510 and operation 520, an operation for forming the device isolation structures 420 on the bottom 412 of the semiconductor substrate 410 can be conducted, as shown in FIG. 4C.

Thereafter, at operation 530, dummy gate structures, such as the I/O dummy gate structure and the core dummy gate structure, are formed over the dielectric layer 430 in the core region R-core and the I/O region R-I/O and cross the fins 414, as shown in FIG. 4E to FIG. 4F.

Then, at operation 540, the dummy gate stacks DP41 and DP42 of the I/O dummy gate structure and the core dummy gate structure are removed to expose portions of the dielectric layer 430 and sidewalls of the first portions 442 of the spacers 440, as shown in FIG. 4I. In some embodiments, operation for forming the sources/drains 470, as shown in FIG. 4G to FIG. 4H, can be conducted between operations 530 and 540. In some embodiments, a doping operation is conducted on the sources/drains 470 to dope the sources/drains 470 with an n-type or p-type dopant.

Thereafter, at operation 550, the oxidizing treatment is conducted on the exposed portions of the dielectric layer 430 and the first portions 442 of the spacers 440, as shown in FIG. 4J.

Then, at operation 560, the exposed portions of the dielectric layer 430 corresponding to the core dummy gate structure are removed, thereby exposing portions of the fins 414 corresponding to the core dummy gate structure, as shown in FIG. 4K, FIGS. 4K' and 4K". However, the exposed portions of the dielectric layer 430 corresponding to the I/O dummy gate structure are not removed. In other words, the exposed portions of the dielectric layer 430 corresponding to the I/O dummy gate structure remain after the exposed portions of the dielectric layer 430 corresponding to the core dummy gate structure are removed.

Thereafter, at operation 570, the gate stacks 450 are formed on the exposed portions of the dielectric layer 430 corresponding to the I/O dummy gate structure and the exposed portions of the fins 414 corresponding to the core dummy gate structure, as shown in FIG. 4L', FIG. 4L" and FIG. 4M.

Because the method 500 includes operation 550 for conducting the oxidizing treatment on the dielectric layer 430, damages caused by previous operations (for example, the operation for doping the sources/drains 470) can be cured to improve the quality of the dielectric layer 430. Further, because the method 500 includes operation 550 for conducting the oxidizing treatment on the spacers 440, the dielectric constant of the first portions 442 of the spacers 440 is decreased to reduce the parasitic capacitance of the FinFET device.

In accordance with an embodiment of the present disclosure, the present disclosure discloses a FinFET device. The FinFET device includes a semiconductor substrate having at least one fin and a gate structure crossing the at least one fin. The gate structure includes two gate stacks, a gate isolation structure and two spacers. The gate isolation structure is disposed between and adjoining the gate stacks. The spacers sandwiches the gate stacks and the gate isolation structure. The spacers include two first portions and a second portion, in which the first portions contact the gate stacks, the second portion contacts the gate isolation structure and the first portions sandwich the second portion. A material of the first portions of the spacers is different from a material of the second portion of the spacers.

In some embodiments, the gate stacks are high-k metal gate structures.

In some embodiments, a dielectric constant of the first portions of the spacers is lower than a dielectric constant of the second portion of the spacers.

In some embodiments, the second portion of the spacers is formed from silicon nitride or silicon carbide.

In some embodiments, the gate isolation structure is formed from nitride.

In accordance with another embodiment of the present disclosure, in the method for fabricating a FinFET device, at first, a semiconductor substrate having at least one fin is provided. Then, a dielectric layer conformal to the at least one fin is formed. Thereafter, a dummy gate structure is formed on the dielectric layer. The dummy gate structure crosses the at least one fin and includes two spacers, two dummy gate stacks and a gate isolation structure. The gate isolation structure is formed between and adjoining the dummy gate stacks. The spacers sandwich the dummy gate stacks and the gate isolation structure, and the spacers include two first portions and a second portion, in which the first portions contact the dummy gate stacks, the second portion contacts the gate isolation structure, and the first portions sandwich the second portion. Then, the dummy gate stacks are removed to expose portions of the dielectric layer and sidewalls of the first portions of the spacers. Thereafter, an oxidizing treatment is conducted on the exposed portions of the dielectric layer and the first portions of the spacers. Then, gate stacks are formed on the exposed portions of the dielectric layer.

In some embodiments, the method for fabricating a FinFET device further includes forming a source/drain on the fin structure.

In some embodiments, the oxidizing treatment is conducted on the exposed portions of the dielectric layer and the first portions of the spacers after forming the source/drain on the at least one fin.

In some embodiments, in the operation for forming the dummy gate structure, a main dummy gate stack on the dielectric layer is formed. Then, the spacers are formed on sidewalls of the main dummy gate stack. Thereafter, the main dummy gate stack is etched to form the dummy gate stacks, in which a gap is located between the dummy gate stacks. Then, the gate isolation structure is formed in the gap.

In some embodiments, a dielectric constant of the first portions of the spacers is lower than a dielectric constant of the second portion of the spacers after the oxidizing treatment is conducted.

In some embodiments, the second portion of the spacers is formed from silicon nitride or silicon carbide.

In some embodiments, the gate isolation structure is formed from nitride.

In accordance with another embodiment of the present disclosure, in the method for fabricating a FinFET device, at first, a semiconductor substrate having fins is provided. Then, a dielectric layer conformal to the fins is formed. Thereafter, dummy gate structures are formed over the dielectric layer in a core region and an I/O region. Each of dummy gate structures crosses the fin and includes two spacers, two dummy gate stacks and a gate isolation structure. The gate isolation structure is formed between and adjoining the dummy gate stacks. The spacers sandwich the dummy gate stacks and the gate isolation structure, and the spacers include two first portions and a second portion, in which the first portions contact the dummy gate stacks, the second portion contacts the gate isolation structure, and the first portions sandwich the second portion. Then, the dummy gate stacks of the dummy gate structures are removed to expose portions of the dielectric layer and sidewalls of the first portions of the spacers of the dummy gate structures. Thereafter, an oxidizing treatment is conducted on the exposed portions of the dielectric layer and the first portions of the spacers of the dummy gate structures. Then, the exposed portions of the dielectric layer corresponding to the dummy gate structure in the core region are removed to expose portions of the fins corresponding to the dummy gate structure in the core region. The exposed portions of the dielectric layer corresponding to the dummy gate structure in the I/O region remain after removing the exposed portions of the dielectric layer corresponding to the dummy gate structure in the core region. Thereafter, gate stacks are formed on the exposed portions of the dielectric layer corresponding to the dummy gate structure in the I/O region and on the exposed portions of the fins corresponding to the dummy gate structure in the core region.

In some embodiments, the exposed portions of the dielectric layer corresponding to the dummy gate structure in the core region are removed before conducting the oxidizing treatment on the exposed portions of the dielectric layer and the first portions of the spacers of dummy gate structures.

In some embodiments, the exposed portions of the dielectric layer corresponding to the dummy gate structure in the core region are removed after conducting the oxidizing treatment on the exposed portions of the dielectric layer and the first portions of the spacers of the dummy gate structures.

In some embodiments, the method for fabricating a FinFET device further includes forming at least one source/drain on the at least one fin structure.

In some embodiments, the oxidizing treatment is conducted on the exposed portions of the dielectric layer and the first portions of the spacers after forming the at least one source/drain on the at least one fin structure.

In some embodiments, a dielectric constant of the first portions of the spacers is lower than a dielectric constant of the second portion of the spacers after the oxidizing treatment is conducted.

In some embodiments, the second portion of the spacers is formed from silicon nitride or silicon carbide.

In some embodiments, the gate isolation structure is formed from nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field-effect transistor (FinFET) device with reduced parasitic capacitance, comprising:
   a semiconductor substrate having at least one fin;

a gate structure crossing the at least one fin, wherein the gate structure comprises:
   two gate stacks;
   a gate isolation structure disposed between and adjoining the gate stacks; and
   two spacers sandwiching the gate stacks and the gate isolation structure, the spacers comprising two first portions and a second portion, wherein the first portions contact the gate stacks, the second portion contacts the gate isolation structure and the first portions sandwich the second portion;
wherein a material of the first portions of the spacers is different from a material of the second portion of the spacers.

2. The FinFET device of claim 1, wherein the gate stacks are high-k metal gate structures.

3. The FinFET device of claim 1, wherein a dielectric constant of the first portions of the spacers is lower than a dielectric constant of the second portion of the spacers.

4. The FinFET device of claim 1, wherein the second portion of the spacers is formed from silicon nitride or silicon carbide.

5. The FinFET device of claim 1, wherein the gate isolation structure is formed from nitride.

6. A method for fabricating a FinFET device with reduced parasitic capacitance, comprising:
   providing a semiconductor substrate having at least one fin;
   forming a dielectric layer conformal to the at least one fin;
   forming a dummy gate structure over the dielectric layer, wherein the dummy gate structure crosses the at least one fin and comprises:
      two dummy gate stacks;
      a gate isolation structure formed between and adjoining the dummy gate stacks; and
      two spacers sandwiching the dummy gate stacks and the gate isolation structure, the spacers comprising two first portions and a second portion, wherein the first portions contact the dummy gate stacks, the second portion contacts the gate isolation structure, and the first portions sandwich the second portion;
   removing the dummy gate stacks to expose portions of the dielectric layer and sidewalls of the first portions of the spacers;
   conducting an oxidizing treatment on the exposed portions of the dielectric layer and the first portions of the spacers; and
   forming gate stacks on the exposed portions of the dielectric layer.

7. The method of claim 6, further comprising forming a source/drain on the at least one fin.

8. The method of claim 7, wherein the oxidizing treatment is conducted on the exposed portions of the dielectric layer and the first portions of the spacers after forming the source/drain on the at least one fin.

9. The method of claim 6, wherein forming the dummy gate structure comprises:
   forming a main dummy gate stack on the dielectric layer;
   forming the spacers on sidewalls of the main dummy gate stack;
   etching the main dummy gate stack to form the dummy gate stacks, wherein a gap is located between the dummy gate stacks; and
   forming the gate isolation structure in the gap.

10. The method of claim 6, wherein a dielectric constant of the first portions of the spacers is lower than a dielectric constant of the second portion of the spacers after the oxidizing treatment is conducted.

11. The method of claim 6, wherein the second portion of the spacers is formed from silicon nitride or silicon carbide.

12. The method of claim 6, wherein the gate isolation structure is formed from nitride.

13. A method for fabricating a FinFET device with reduced parasitic capacitance, comprising:
   providing a semiconductor substrate having plural fins;
   forming a dielectric layer conformal to the fins;
   forming dummy gate structures over the dielectric layer in a core region and an I/O region, wherein each of dummy gate structures crosses the fins and comprises:
      two dummy gate stacks;
      a gate isolation structure formed between and adjoining the dummy gate stacks; and
      two spacers sandwiching the dummy gate stacks and the gate isolation structure, the spacers comprising two first portions and a second portion, wherein the first portions contact the dummy gate stacks, the second portion contacts the gate isolation structure, and the first portions sandwich the second portion;
   removing the dummy gate stacks of the dummy gate structures to expose portions of the dielectric layer and sidewalls of the first portions of the spacers of the dummy gate structures;
   conducting an oxidizing treatment on the exposed portions of the dielectric layer and the first portions of the spacers of the dummy gate structures;
   removing the exposed portions of the dielectric layer corresponding to the dummy gate structure in the core region to expose portions of the fins corresponding to the dummy gate structure in the core region, wherein the exposed portions of the dielectric layer corresponding to the dummy gate structure in the I/O region remain after removing the exposed portions of the dielectric layer corresponding to the dummy gate structure in the core region; and
   forming gate stacks on the exposed portions of the dielectric layer corresponding to the dummy gate structure in the I/O region and on the exposed portions of the fins corresponding to the dummy gate structure in the core region.

14. The method of claim 13, wherein the exposed portions of the dielectric layer corresponding to the dummy gate structure in the core region are removed before conducting the oxidizing treatment on the exposed portions of the dielectric layer and the first portions of the spacers of dummy gate structures.

15. The method of claim 13, wherein the exposed portions of the dielectric layer corresponding to the dummy gate structure in the core region are removed after conducting the oxidizing treatment on the exposed portions of the dielectric layer and the first portions of the spacers of the dummy gate structures.

16. The method of claim 13, further comprising forming at least one source/drain on the at least one fin structure.

17. The method of claim 16, wherein the oxidizing treatment is conducted on the exposed portions of the dielectric layer and the first portions of the spacers after forming the at least one source/drain on the at least one fin structure.

18. The method of claim 13, wherein a dielectric constant of the first portions of the spacers is lower than a dielectric constant of the second portion of the spacers after the oxidizing treatment is conducted.

19. The method of claim 13, wherein the second portion of the spacers is formed from silicon nitride or silicon carbide.

20. The method of claim 13, wherein the gate isolation structure is formed from nitride.

* * * * *